United States Patent
Ausserlechner et al.

(10) Patent No.: US 7,437,260 B2
(45) Date of Patent: *Oct. 14, 2008

(54) CONCEPT OF COMPENSATING FOR PIEZO INFLUENCES ON INTEGRATED CIRCUITRY

(75) Inventors: Udo Ausserlechner, Villach (AT); Mario Motz, Wernberg (AT)

(73) Assignee: Infineon Technologies AG, Munich (DE)

( * ) Notice: Subject to any disclaimer, the term of this patent is extended or adjusted under 35 U.S.C. 154(b) by 396 days.

This patent is subject to a terminal disclaimer.

(21) Appl. No.: 11/037,536

(22) Filed: Jan. 17, 2005

(65) Prior Publication Data

US 2005/0162160 A1 Jul. 28, 2005

(30) Foreign Application Priority Data

Jan. 26, 2004 (DE) .................. 10 2004 003 853

(51) Int. Cl.
*G01R 35/00* (2006.01)

(52) U.S. Cl. .............. 702/107; 324/251; 324/252; 327/511; 257/427; 323/293; 323/294; 73/1.15; 73/1.48; 73/35.11; 73/514.34; 73/721; 73/727

(58) Field of Classification Search ............ 702/107; 324/251–252; 327/511; 257/427; 323/293–294; 73/1.15, 1.48, 35.11, 35.13, 514.34, 721, 73/727

See application file for complete search history.

(56) References Cited

U.S. PATENT DOCUMENTS 4,703,302 A 10/1987 Hino et al.
4,739,381 A 4/1988 Miura et al.
6,653,688 B2 11/2003 Takasu et al.
7,302,357 B2 * 11/2007 Ausserlechner et al. ..... 702/107

FOREIGN PATENT DOCUMENTS

DE 10 2004 003 853.8 1/2004

OTHER PUBLICATIONS

J.F. Creemer, P.J. French, "A New Model of the Effect of Mechanical Stress on The Saturation Current of Bipolar Transistors," Jul. 5, 2001.*

(Continued)

*Primary Examiner*—Tung S. Lau
*Assistant Examiner*—Sujoy K Kundu
(74) *Attorney, Agent, or Firm*—Eschweiler & Associates LLC

(57) ABSTRACT

A semiconductor chip includes a first functional element having a first electronic functional-element parameter exhibiting a dependence relating to the mechanical stress present in the semiconductor circuit chip, and being configured to provide a first output signal, a second functional element having a second electronic functional-element parameter exhibiting a dependence in relation to the mechanical stress present in the semiconductor circuit chip, and being configured to provide a second output signal in dependence on the second electronic functional-element parameter and the mechanical stress, and a combination means for combining the first and second output signals to obtain a resulting output signal exhibiting a predefined dependence on the mechanical stress present in the semiconductor circuit chip, the first and second functional elements being integrated on the semiconductor circuit chip and arranged, geometrically, such that that the first and second functional-element stress influence functions are identical within a tolerance range.

42 Claims, 7 Drawing Sheets

OTHER PUBLICATIONS

J.F. Creemer et al.; "Anisotropy of the Piezojunction Effect in Silicon Transistors"; Technical Digest; The Fifteenth IEEE International Conference on Micro Electro Mechanical Systems, Jan. 20-24, 2002.

Fabiano Fruet et al.; "The Piezojunction effect in NPN and PNP Vertical transistors and its influence on silicon temperature sensors"; Sensors and Actuators 85; pp. 70-74, 2000.

Buddhika Abesingha; et al.; "Voltage Shift in Plastic-Packaged Bandgap References"; IEEE Transactions on Circuits and Systems-11: Analog and Digital signal Processing, vol. 49, No. 10, Oct. 2002.

Fabiano Fruett, et al.; "Minimization of the Mechanical-Stress-Induced Inaccuracy in Bandgap Voltage references"; IEEE Journal of Solid-State Circuits, Vo. 38, No. 7, Jul. 2003.

F. Fruett, et al.; "Compensation of Piezoresistivity effect in p-type implanted resistors"; Electronic Letters 2nd, Vo.. 35, No. 18, Sep. 1999.

R.C. Jaeger et al.,; "CMOS Stress Sensors on (100) Silicon"; IEEE JSSC; vol. 35, No. 1, Jan. 2000.

J.F. Creemer et al.; "A New Model of the Effect of Mechanical Stress on the Saturation Current of Bipolar Transistors"; Sensors and Actuators A97-98, 2002.

Abesingha, Buddhika et al., "Voltage Shift in Plastic-Packaged Bandgap References", IEEE Transactions on Circuits and Systems—II: Analog and Digital Signal Processing, vol. 49, No. 10, pp. 681-685, Oct. 2002.

Creemer, J.F., et al., "A New Model of the Effect of Mechanical Stress on the Saturation Current of Bipolar Transistors", Delft University of Technology, Sensors and Actuators A 97-98 (2002), pp. 289-295, 2002.

Creemer, J.F., et al., "Anisotropy of the Piezojunction Effect in Silicon Transistors", Technical Digest, The Fifteenth IEEE International Conference on Micro Electro Mechanical Systems, pp. 316-319, Jan. 20, 2002.

Fruett, Fabiano, et al., "The Piezojunction Effect in NPN and PNP Vertical Transistors and its Influence on Silicon Temperature Sensors", Delft University of Technology, Sensors and Actuators 85 (2000), pp. 70-74, 2000.

Fruett, Fabiano, et al., "Minimization of the Mechanical-Stress-Induced Inaccuracy in Bandgap Voltage References", Journal of Solid-State Circuits, vol. 38, No. 7, pp. 1288-1291, Jul. 2003.

Fruett, Fabiano, et al., "Compensation of Piezoresistivity Effect in p-Type Implanted Resistors", Electronics Letters, vol. 35, No. 18, pp. 1587-1588, Sep. 2, 1999.

Jaeger, Richard C., et al., "CMOS Stress Sensors on (100) Silicon", Jounal of Solid-State Circuits, vol. 35, No. 1, pp. 85-95, Jan. 2000.

\* cited by examiner

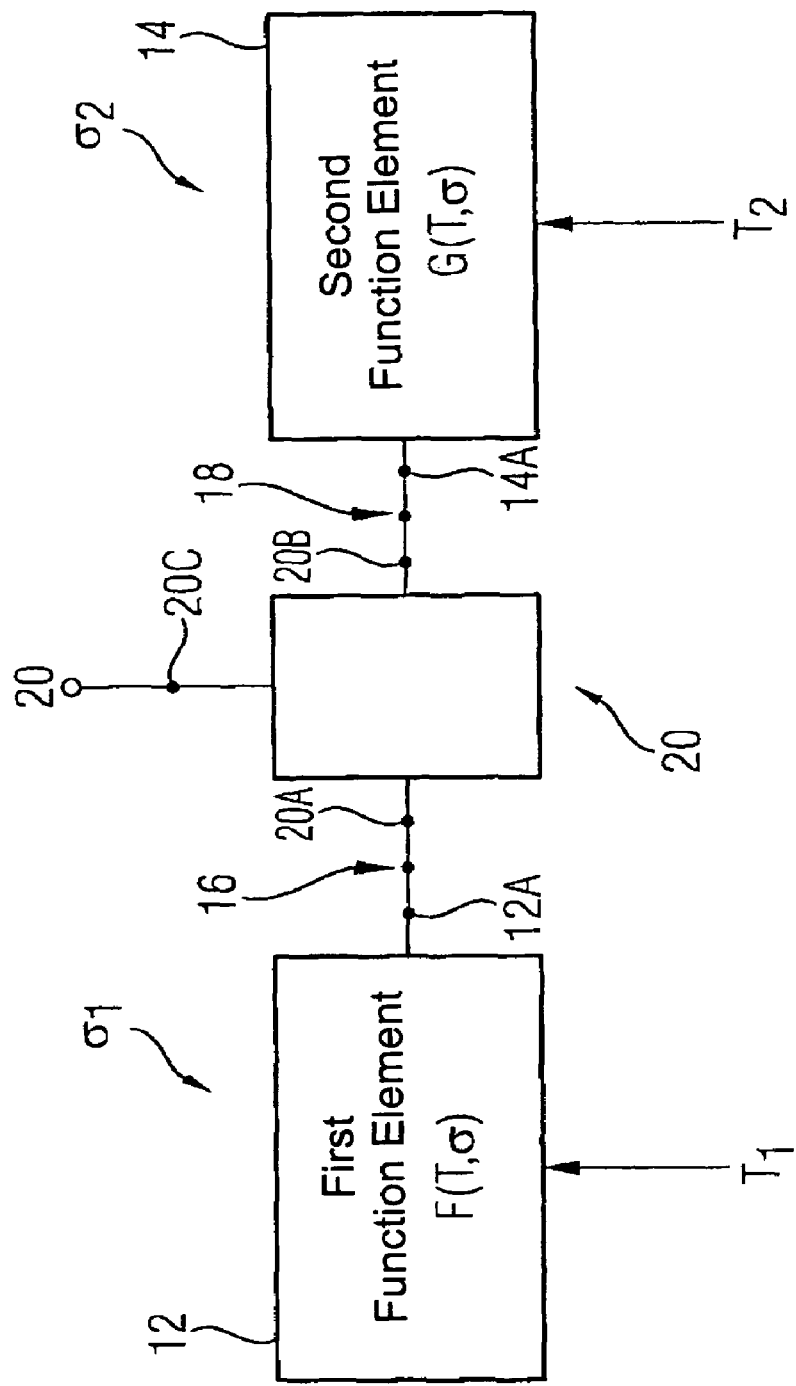

US 7,437,260 B2

CONCEPT OF COMPENSATING FOR PIEZO INFLUENCES ON INTEGRATED CIRCUITRY

PRIORITY

This application claims priority from German Patent Application No. 102004003853.8, which was filed on Jan. 26, 2004.

TECHNICAL FIELD OF THE INVENTION

The present invention relates to integrated circuitries in a semiconductor substrate, and in particular to a concept of compensating the negative influence of a mechanical stress component in the semiconductor substrate on the parameter accuracy and parameter stability of the circuitry integrated on the semiconductor substrate.

DESCRIPTION OF PRIOR ART

Integrated circuitries, or integrated circuits (ICs), are typically mounted in packages to protect the sensitive integrated circuitries from environmental influences. However, one disadvantageous side effect that may be observed is that accommodating and mounting the integrated circuitry in a package exerts considerable mechanical stress on the semiconductor material, and thus on the semiconductor substrate of the integrated circuitry.

This applies, in particular, to low-cost package shapes configured as mass articles, such as to package forms wherein a sealing compound is injected around the integrated circuitry. The sealing compound hardens by cooling down to ambience temperature from a temperature of about 150° C.-185° C. Since the semiconductor material of the integrated circuitry and the plastic sealing material of the package surrounding the integrated circuitry exhibit thermal expansion coefficients which do not match, during the cooling to ambient temperature, i.e. room temperature, the plastic materials will shrink more and exert essentially non-reproducible mechanical stress on the semiconductor material of the integrated circuitry. The plastic material generally has a higher thermal expansion coefficient than the semiconductor material of the integrated circuitry, the semiconductor materials used mostly being silicon or even germanium, gallium arsenide (GaAs), InSb, InP, etc.

The mechanical stress, or the mechanical strain, present in the semiconductor material of the semiconductor substrate and acting on the integrated circuitry is generally hard to reproduce because the mechanical stress depends on the combination of the materials used for the semiconductor substrate and for the sealing compound, and, in addition, on the processing parameters, such as the hardening temperature and hardening period of the sealing compound of the package of the integrated circuitry.

Various piezo effects present in the semiconductor material, such as the piezoresistive effect, piezo MOS effect, piezojunction effect, piezo Hall effect and piezo-tunnel effect, also influence important electrical and/or electronic parameters of the integrated circuitry due to mechanical stress of the integrated circuitry which is operating. In connection with the description below, the generic term "piezo effects" is to generally refer to the changes of electrical and/or electronic parameters of the circuitry integrated in the semiconductor material under the influence of mechanical stress in the semiconductor material.

Mechanical stress in the semiconductor material results in a change in the properties of the charge carriers with regard to the charge-carrier transport, such as mobility, collision time, scattering factor, Hall constant, etc.

In more general words, the piezoresistive effect determines how the specific ohmic resistance of the respective semiconductor material will behave under the influence of mechanical stress. The piezojunction effect results, among other things, in changes in the characteristics of diodes and bipolar transistors. The piezo Hall effect describes the dependence of the Hall constant of the semiconductor material on the mechanical stress condition in the semiconductor material.

The piezo-tunnel effect occurs at reversely operated, highly doped, shallow lateral pn junctions. This current is dominated by band-to-band tunnel effects and is also dependent on stresses.

In connection with the present invention it is also to be noted that the piezoresistive effect and the term "piezo MOS effect", which may occasionally be found in literature, are comparable, since with the piezo MOS effect, essentially just like with the piezoresistive effect, the mobility of the charge carriers in the MOS channel of an MOS field-effect transistor changes under the influence of the mechanical stress present in the semiconductor material of the integrated circuit chip.

It therefore becomes clear that due to mechanical stresses in the semiconductor material of an integrated circuitry, the electrical and/or electronic characteristics of the integrated circuitry could be changed, or negatively affected, in a non-predictable manner, a reduction in the performance, or parameter, of the integrated circuitry being noticeable, e.g., in the form of an impairment of the dynamic range, the resolution, the bandwidth, the power consumption or the accuracy etc.

Specifically, the above-mentioned piezoresistive effect indicates how the specific ohmic resistance $\rho$ of the respective semiconductor material behaves under the influence of a mechanical stress tensor $\sigma$ and of the piezoresistive coefficients $\pi$:

$$\rho = \rho_0 (1 + \Sigma \pi_{i,j} \sigma_{i,j})$$

Here, factor $\rho_0$ is the basic value of the specific resistance which remains unaffected by the mechanical stress.

In integrated circuitries (ICs), the respective current I, e.g. a control current, a reference current etc., is generated by circuit elements of the integrated circuitry on the semiconductor chip. Here, a defined voltage U is produced at an integrated resistor having the resistance R, and current I is decoupled. Current I may generally also be generated at any resistive element, e.g. also at a MOS field-effect transistor located in the linear operating range.

The voltage U may also be created, e.g., by known bandgap principles, in a manner which is relatively constant in relation to mechanical stresses in the semiconductor material (apart from the comparatively small piezojunction effect on the bandgap voltage produced). The resistance R, however, is subject to the piezoresistive effect in accordance with the following relationship:

$$R = R_0 (1 + \Sigma \pi_{i,j} \sigma_{i,j})$$

Here, factor $R_0$ is the basic value of the resistance, which remains unaffected by the mechanical stress, and the value $\pi_{ij}$ is a piezoresistive coefficient. Thus, the current I produced at the resistive element may be expressed as follows:

$$I = U/R = U/(R_0 (1 + \Sigma \pi_{ij} \sigma_{ij}))$$

If the mechanical pressure present on the semiconductor, and thus the mechanical stress present in the semiconductor may be subdivided into an essentially constant basic value $\sigma_{0ij}$ and a pressure fluctuation $\delta\sigma_{ij}$ which is mostly fairly small and is variable across operating conditions and service life, i.e. may be subdivided into $\sigma_{ij}=\sigma_{0ij}\pm\delta\sigma_{ij}$, the current may be expressed as follows, in linear approximation:

$$I=I_0(1+\Sigma\pi_{ij}\delta\sigma_{ij}), \text{ with}$$

$$I_0 U/(R_0(1+\Sigma\pi_{ij}\sigma_{0ij}))$$

It also becomes clear that the factor taken from the coefficient $\pi_{ij}$ and the pressure fluctuation $\delta\sigma_{ij}$ is problematic and could produce an interference with regard to current I generated, and should come as close to zero as possible.

Since mechanical stresses present in the semiconductor material have an impact on the semiconductor circuit chip, due to the package of the integrated circuitry, in a manner which is difficult to control, the resistance R used for generating current I, and therefore also current I which has been generated, are changed in an undesired and unpredictable manner.

The piezo Hall effect, in contrast, describes the dependence of the Hall constant $R_h$ on the condition of mechanical stress in the semiconductor material, with:

$$R_h=R_{h0}(1+\Sigma P_{i,j}\sigma_{i,j})$$

$\sigma_{ij}$ is the mechanical stress tensor, $P_{ij}$ are the piezo Hall coefficients, the summation extending across $i=1\ldots3$ and $j=1\ldots3$ with the piezo Hall effect (and the piezoresistive effect).

Both the piezoresistive effect and the piezo Hall effect are highly disruptive in the operation of integrated circuitry, in particular a sensor array, such as an integrated Hall probe, including control electronics and evaluation electronics.

Due to the piezo Hall effect, which occurs in the semiconductor material of the semiconductor chip of the integrated circuitry also as a result of mechanical stresses, the current-related sensitivity $S_i$ of the Hall probe changes as follows, e.g. in the case of a Hall probe array:

$$S_i = \frac{U_h}{I_H B} = \frac{R_h}{t} g$$

$U_h$ is the Hall voltage present at the output side of the Hall probe, $I_H$ is the current (control current) flowing through the Hall probe, B is the magnetic flux density to be detected, t is the effective thickness of the active layer of the Hall probe, and g is a geometry factor describing the influence of the contact electrodes on the Hall voltage.

As a result of the piezoresistive effect in the presence of mechanical stresses in the semiconductor material of the Hall-probe array, Hall current $I_H$ flowing through the Hall probe will change, since Hall current $I_H$ (control current) is defined, in addition, for example, only across a co-integrated resistance R where a voltage U is made to drop, possibly by means of a control loop. A change in the Hall current $I_H$ due to the change in the resistance as a result of the piezoresistive effect therefore leads to a change in the sensitivity S of the Hall probe, since the sensitivity S of the Hall probe is identical with the product of the current-related sensitivity $S_i$ times the Hall current $I_H$:

$$S=S_i I_h=U_h/B \propto S_i/R$$

The magnetic sensitivity of the Hall probe S may be defined (as indicated above) as the ratio of the output voltage $U_H$ of the Hall probe to the operating magnetic-field component B.

A mechanical stress $\sigma_{ij}$ present in the semiconductor material of the Hall-probe array therefore influences the current-related magnetic sensitivity $S_i$ of a Hall probe in accordance with $$S_i=S_{i0}(1+\Sigma P_{ij}\sigma_{ij})$$

Factor $S_{i0}$ is the basic value of the current-related magnetic sensitivity, which remains unaffected by the mechanical stress, and factor $P_{ij}$ is a piezo Hall coefficient.

Generally, attempts have been made at keeping the magnetic sensitivity S of a Hall probe as constant as possible, with influences due to mechanical stress due to the piezoresistive effects and piezo Hall effects set forth above being disruptive, in particular.

With regard to integrated Hall sensor circuitries generating a switching signal dependent on the operating magnetic-field component B, one should take into account that the magnetic switching threshold $B_S$ may always be returned to the following form:

$$B_S \propto R/S_i$$

Thus, it can generally be said that the ratio of the current-related magnetic sensitivity $S_i$ to a resistance R is decisive for the magnetic parameters, such as the sensitivity or the switching thresholds of a Hall-probe array.

Eventually, mechanical stresses in the semiconductor material of an integrated circuitry thus have a negative influence on the magnetic sensitivity and/or the switching thresholds of a total system structured by a Hall-probe array.

In practice, magnetic switching sensors show, prior to the packaging process (i.e. on a wafer plane), switching thresholds which differ by about 10% from those switching thresholds after accommodation in a package. The reasons for this are the above-mentioned piezo effects. In particular, after being accommodated in a package, an undesired behavior of the "magnetic switching thresholds versus temperature" in the form of a hysteresis loop may be observed, which opens between 1% and 4%, this being observable, in particular, if the IC package had absorbed a lot of moisture prior to or during the packaging process and if the dwelling time of the semiconductor circuit chip with temperatures above 100° C. is more than 10 minutes (this is typically the diffusion time constant of small packages for integrated circuits). The reasons for this are, again, the above-mentioned piezo effects.

With regard to the piezo effects represented above it should be noted that the coefficients $\sigma_{ij}$, $P_{ij}$ and $\pi_{ij}$ defining the mechanical stresses occurring in the semiconductor material are so-called "tensors", i.e. that the current-related magnetic sensitivity $S_i$ of a Hall element and the resistance R of a resistive element do change not only because of the magnitude of the mechanical stress in the semiconductor material, but also because of the direction of the stress in the semiconductor material. The pronounced directional dependence of the influence of a mechanical stress present in the semiconductor material on electrical and electronic parameters of an integrated circuitry have been known in the art. Thus, the scientific publication [1] "Anisotropy of the Piezojunction Effect in Silicon Transistors" by Creemer, J. F.; French, P. J. in Technical Digest MEMS 2002, the 15. IEEE international conference on Micro Electro Mechanical Systems, Las Vegas, pp. 316 ff, relates to the anisotropy of the piezojunction effect in silicon transistors.

The piezojunction effect indicates how mechanical stresses present in a semiconductor material lead to a shift of the energy level of the band edges of the semiconductor material which result, among other things, in changes in the characteristics of diodes and bipolar transistors.

When mounting an integrated semiconductor circuit chip (IC) in a plastic package, mechanical stresses occur in the semiconductor material of the integrated semiconductor circuit chip, as described above. The mechanical stress present in the semiconductor material influences, by means of the piezojunction effect, the saturation current $I_S$ due to changes in the mobility of the minority carriers $\Delta\mu$ and changes in the intrinsic charge-carrier concentration $\Delta n_i$:

$$\frac{\Delta I_S}{I_S} \cong \frac{\Delta\mu}{\mu} + \frac{\Delta n_i^2}{n_i^2}$$

By means of the known exponential characteristics, the collector current or the base-emitter voltage of a transistor is influenced:

$$I_C = I_S \exp\left(\frac{qV_{BE}}{kT}\right)$$

$V_{BE}$ is the base-emitter voltage of a bipolar transistor, q is the elementary charge, and T is the absolute temperature. These connections have been well known in literature. The scientific publication [2] "The piezojunction effect in NPN and PNP vertical transistors and its influence on silicon temperature sensors" by Fabiano Fruet, Guijie Wang, Gerard C. M. Meijer in Sensors and Actuators 85 (2000) 70-74 relates to the piezojunction effect in vertical npn- and pnp-type transistors and its influence on silicon temperature sensors.

If, for example, a bipolar transistor is used for a constant-voltage source, the bandgap voltage $V_{BG}$ of the constant-voltage source is influenced by the piezojunction effect and by the piezoresistive effect because of the mechanical stress in the semiconductor material. The base-emitter voltage $V_{BE}$ of the bipolar transistor contained in the constant-voltage source changes because of the piezojunction effect and also because of the piezoresistive effect, since the resistances of the resistors contained in the constant-voltage source are influenced by the piezoresistive effect.

The bandgap voltage $V_{BG}$ is formed, as is known, by the base-emitter voltage $V_{BE}$ and the temperature voltage $V_{PTAT}$ (PTAT=voltage proportional to the absolute temperature), the negative temperature dependence of the base-emitter voltage $V_{BE}$ being compensated for by a positive temperature dependence of the temperature voltage $V_{PTAT}$ (=$\Delta V_{BE}$). The temperature voltage $V_{PTAT}$ is essentially independent of piezo effects since the temperature voltage $V_{PTAT}$ is formed only by current-density ratios in the bipolar transistors, it being possible to adjust the current-density ratios in a very precise and constant manner by means of layout and design measures. In contrast, the currents in bandgap circuits, however, are in turn defined by resistors, which are subject to piezoresistive effects due to mechanical stresses present in the semiconductor material, e.g. due to being accommodated in a package. Taking into account the piezoresistive effect on the resistance of the integrated resistor (resistive element), the temperature current ($I_{PTAT}$) may be expressed as follows:

$$I_{PTAT} = \frac{V_{PTAT}}{R_1}$$

Accordingly, the following applies to current $I_{VBE}$, which is formed by means of a base-emitter voltage $V_{BE}$ and a resistance R2 of a further resistor:

$$I_{VBE} = \frac{V_{BE}}{R_2}$$

Here, too, mechanical stresses present in the semiconductor material have an effect on the semiconductor circuit chip which is difficult to control, since humidity, material constants and geometries of the packages may vary. Thereby, both the resistance of the reference resistor for generating the operating current flowing through the bandgap circuit, as well as the base-emitter voltage $V_{BE}$ used in the bandgap circuit, and thus the stability of the constant voltage (bandgap voltage), $V_{BG}$, are changed in an undesired manner.

The bandgap principle is used, for example, with temperature sensors due to its technological robustness. Due to the above-mentioned piezo effects, however, both the reference resistance for generating the operating currents in such a temperature sensor, and the base-emitter voltage $V_{BE}$ used in the temperature sensor, and thus the stability of the temperature measurement, i.e., for example, long-term drift, influence of humidity etc., are changed in an undesired manner by means of scattering due to the fact that the integrated semiconductor circuit chip is accommodated in a plastic package.

Prior to the wafer-level packaging process, i.e. prior to being accommodated in a package, bandgap circuits exhibit voltage values differing by about 0.5 to 2% from the voltage values established once the bandgap circuits are accommodated in a package, the reason for this being the so-called piezo effects. Accordingly, prior to the wafer-level packaging process, temperature sensors exhibit temperature readings (or with temperature switches, temperature threshold values) differing by about 1-5° C. from temperature sensors accommodated in the package due to the above-mentioned piezo effects.

Since the factors $\sigma_{ij}$, $P_{ij}$ and $\pi_{ij}$ represented in the above formulae are so-called tensors, the base-emitter voltages $V_{BE}$ and the resistances R which are used in the bandgap circuit change not only due to the quantities of the respective mechanical stresses, but also due to the direction of the stresses in relation to the semiconductor material. With regard to examinations with regard to the directional dependence, reference shall be made to the scientific publications mentioned below. The directional dependence of the mechanical stress in the semiconductor material applies to the {100} silicon material for p- and n-doped resistors, which is used for the most part. In addition, it is to be noted that {100} wafers and {001} wafers correspond to one another, for reasons of symmetry, in cubic crystals. In the literature mentioned below, both notations are used. For the piezojunction effect of parasitic vertical pnp substrate transistors, which are used, for the most part, in modem CMOS technologies, there are also known figures for stress dependence. Stress dependence is non-directional essentially for in-plane normal, or direct, stress (main-axis stress components on the chip level) in a {100} material for vertical bipolar transistors. Because of the stress dependence of the saturation current of a bipolar transistor, the base-emitter voltage $V_{BE}$ becomes stress-dependent, in dependence on the collector current $I_C$, essentially across the logarithmic characteristic, so that:

$$U_{BE} = f(I_c)$$

Below, a brief explanation will be given of how attempts have been made, in accordance with the prior art, at reducing the above disruptive piezo influences. It has been known in the art that with {100} silicon material, the mechanical stress dependence of integrated resistors may be reduced by using p-doped resistors instead of n-doped resistors as much as possible, since p-doped integrated resistors generally have smaller piezo coefficients. In addition, n-type resistors are oriented, in general, such that the major part of the current flow flows in a <110> direction, whereas p-type resistors, in contrast, are rotated by an angle of 45° thereto, since p-type resistors generally have smaller piezo coefficients in <100> directions.

In addition, the art has known arrangements, wherein two nominally equal resistors are arranged to be perpendicular to one another and to have a small distance from one another in the layout, and are electrically connected in series or in parallel. Thereby, the total resistance becomes as independent as possible of the direction of the mechanical stress present in the semiconductor material, and therefore becomes reproducible as much as possible. At the same time, the piezo sensitivity of such an arrangement for any direction of the mechanical stress will also become minimal.

In addition, efforts have been made in the art to configure the IC package such that the mechanical stresses acting upon the semiconductor circuit chip may become easier to reproduce. To this effect, the art has either used expensive ceramic packages, or the mechanical parameters of the package components, i.e. semiconductor circuit chip, lead frame, sealing compound, adhesive material or soldering material, are matched such that the influences of the different package components compensate for one another as much as possible or are at least as constant as possible with regard to assembly batch and stress load of the integrated circuitry on the fly. However, it should become clear that matching the mechanical parameters of the package components is extremely expensive, and that, in addition, the slightest changes in the progress of the process again will lead to a change in the influences of the various package components.

Up to now, efforts have been made, in the prior art, to reduce the above-mentioned piezo influences on bandgap circuits by means of suitable devices, e.g. vertical pnp transistors and polysilicon resistors or silicon-chrome resistors, and, additionally, by means of suitable package techniques, e.g. ceramic packages, low-stress plastic materials, grain size of the filler material in plastic, etc., all of which has also been supposed to reduce influences due to humidity and lifetime drift.

The scientific publication [3] "Voltage Shift in Plastic-Packaged Bandgap References" by Buddhika Abesingha, Gabriel A. Rincón-Mora and David Briggs in IEEE TRANSACTIONS ON CIRCUITS AND SYSTEMS—II: ANALOG AND DIGITAL SIGNAL PROCESSING, Vol. 49, No. 10, October 2002, pp. 681 relates to voltage shifts of bandgap reference voltage sources accommodated in a plastic package. The scientific publication [4] "Minimization of the Mechanical-Stress-Induced Inaccuracy in Bandgap Voltage References" by Fabiano Fruett, Gerard C. M. Meijer, and Anton Bakker in IEEE JOURNAL OF SOLID-STATE CIRCUITS, Vol. 38, No. 7, July 2003, pp. 1288-1291, relates to minimizing the inaccuracies caused by mechanical stress in bandgap reference voltage sources by using vertical pnp transistors and chopper techniques.

The scientific publication [5] "Compensation for piezoresistivity effect in p-type implanted resistors" by F. Fruett, G. C. M. Meijer in Electronic letters 2 Sep. 1999, Vol. 35, No. 18, pp. 1587, relates to the compensation for the piezoresistive effect in implanted p-type resistors.

The above illustrations and the above-mentioned scientific publications clearly show that an influence, which is undesired and difficult to control, on the physical functional parameters of semiconductor devices of integrated circuitries on a semiconductor circuit chip may be caused by mechanical stresses in the semiconductor material by means of various piezo effects. A compensation for the influence of the piezo effects on the physical and electronic functional parameters of the semiconductor devices is problematic in that the stress components occurring in the semiconductor material are generally neither known in advance, nor do they remain constant during the life period, so that when the integrated circuitry is accommodated in a package, the mechanical parameters, i.e., for example, the material of the semiconductor chip, the lead frame, the sealing compound, the adhesive or the solder material, are difficult or impossible to match with one another so as to check the above-mentioned piezo influences on the semiconductor material, and, thus, on the electronic and physical functional parameters of the semiconductor devices in a suitable manner.

SUMMARY OF THE INVENTION

Starting from this prior art, it is the object of the present invention to provide an improved concept for compensating for piezo influences on integrated circuitry.

In accordance with a first aspect, the invention provides a circuitry on a semiconductor circuit chip, having: a first functional element having a first electronic functional-element parameter, the first electronic functional-element parameter exhibiting a dependence in relation to the mechanical stress in the semiconductor circuit chip in accordance with a first functional-element stress influence function, the first functional element being configured to provide a first output signal in dependence on the first electronic functional-element parameter and the mechanical stress, a second functional element having a second electronic functional-element parameter, the second electronic functional-element parameter exhibiting a dependence in relation to the mechanical stress in the semiconductor circuit chip in accordance with a second functional-element stress influence function, the second functional element being configured to provide a second output signal in dependence on the second electronic functional-element parameter and the mechanical stress, and a combination means for combining the first and second output signals to obtain a resulting output signal with a predefinable dependence on the mechanical stress in the semiconductor circuit chip, the first and second functional elements being integrated on the semiconductor circuit chip and arranged, geometrically, such that the first and second functional-element stress influence functions are identical within a tolerance range.

In accordance with a second aspect, the invention provides a method of generating an output signal of a circuitry on a semiconductor circuit chip, including: generating, by means of a first functional element, a first output signal in dependence on a first electronic functional-element parameter of the first functional element, and on the mechanical stress in the semiconductor circuit chip, the first electronic functional-element parameter exhibiting a dependence in relation to the mechanical stress in the semiconductor circuit chip in accordance with a first functional-element stress influence function, and generating, by means of a second functional element, a second output signal in dependence on a second electronic functional-element parameter of the second functional element, and on the mechanical stress in the semiconductor circuit chip, the second electronic functional-element parameter exhibiting a dependence in relation to the mechanical stress in the semiconductor circuit chip in accordance with a second functional-element stress influence function, and combining the first and second output signals to obtain the resulting output signal of the circuitry with a predefinable dependence on the mechanical stress in the semiconductor circuit chip, the first functional element and the second functional element being integrated on the semiconductor circuit chip and arranged, geometrically, such that the first and second functional-element stress influence functions are identical within a tolerance range.

The inventive circuitry on a semiconductor chip includes a first functional element having a first electronic functional-element parameter, the first electronic functional-element parameter exhibiting a dependence with regard to the mechanical stress in the semiconductor circuit chip according to a first functional-element stress influence function, the first functional element being configured to provide a first output signal in dependence on the first electronic functional-element parameter and the mechanical stress, a second functional element having a second electronic functional-element parameter, the second electronic functional-element parameter exhibiting a dependence in relation to the mechanical stress in the semiconductor circuit chip in accordance with a second functional-element stress influence function, the second functional element being configured to provide a second output signal in dependence on the second electronic functional-element parameter and the mechanical stress, and a combination means for combining the first and second output signals to obtain a resulting output signal with a predefined dependence on the mechanical stress in the semiconductor circuit chip, the first and second functional elements being integrated on the semiconductor circuit chip and arranged, geometrically, such that the first and second functional-element stress influence functions are identical within a tolerance range.

An inventive method of producing an output signal of a circuitry on a semiconductor circuit chip comprises generating, by means of a first functional element, a first output signal in dependence on a first electronic functional-element parameter of the first functional element, and on the mechanical stress in the semiconductor circuit chip, the first electronic functional-element parameter exhibiting a dependence with regard to the mechanical stress in the semiconductor circuit chip in accordance with a first functional-element stress influence function, and generating, by means of a second functional element, a second output signal in dependence on a second electronic functional-element parameter of the second functional element, and on the mechanical stress in the semiconductor circuit chip, the second electronic functional-element parameter exhibiting a dependence with regard to the mechanical stress in the semiconductor circuit chip in accordance with a second functional-element stress influence function, and combining the first and second output signals to obtain the resulting output signal of the circuitry with a predefined dependence on the mechanical stress in the semiconductor circuit chip, the first functional element and the second functional element being integrated on the semiconductor circuit chip and arranged, geometrically, such that the first and second functional-element stress influence functions are identical within a tolerance range.

The present invention is based on the findings that the impact of a piezo effect on an electronic functional parameter of a semiconductor device may be compensated for, or that a desired setting of a remaining piezo dependence may be performed, by combining and/or mixing the electronic functional parameter of the semiconductor device with a further electronic functional parameter of a further semiconductor device (or of the same semiconductor device) (and/or by combining signals obtained by means of the first and second functional parameters), the further electronic functional parameter being subject to a further piezo influence.

The inventive compensation for piezo influences on a semiconductor circuit device by combining various piezo effects is achieved, in accordance with the invention, in that preferably two semiconductor devices, which are both integrated on a semiconductor circuit chip so as to be as close to one another as possible, are arranged, geometrically, such that the piezo influences on the two electronic functional parameter which are influenced by piezo effects exhibit predefined directional dependencies within a tolerance range, and exhibit, preferably, identical directional dependencies and/or stress-influence functions or are both non-directional. This enables the achievement of a mutual compensation for the impact, caused by varying piezo effects, on the electronic functional parameters of the electronic semiconductor devices by means of a combination of the various piezo influences and, in particular, by a simple linear combination of same.

In accordance with the invention, the piezo dependence of the scalar electronic functional parameter F may be represented as a product of a scalar, temperature-dependent piezo coefficient $\pi_F(T)$ and any scalar function, which may also be non-linear, of the stress tensor $f(\underline{\underline{\sigma}})$:

$$F(T) = F_0(T)(1 + \pi_F(T) f_F(\underline{\underline{\sigma}})),$$

with $f_F(\underline{\underline{\sigma}}) = 0$ if $\underline{\underline{\sigma}} = \underline{\underline{0}}$ The terms with double underlining indicate a matrix representation.

The function of the stress tensor $f(\underline{\underline{\sigma}})$ will be referred to below as a so-called "functional-element stress influence function" of the functional-element parameter F. If a further, second electronic functional-element parameter G can be represented as follows:

$$G(T) = G_0(T)(1 + \pi_G(T) f_G(\underline{\underline{\sigma}})),$$

with $f_G(\underline{\underline{\sigma}}) = 0$ if $\underline{\underline{\sigma}} = \underline{\underline{0}}$ the inventive compensation for various piezo effects may be performed as follows:

Initially, a prerequisite is that the functional-element stress influence functions are made to be identical by configuring the functional elements in a suitable manner (in {100}-Si, with Hall probes, no specific configuration measures are needed; with bipolar transistors, one should use, e.g., vertical types; with resistors, one should use, e.g., an L layout), so that:

$$f_F(\underline{\underline{\sigma}}) = f_G(\underline{\underline{\sigma}})$$

so that in the following, we will only need to speak of functional-element stress influence functions $f(\underline{\underline{\sigma}})$.

The output signal of the integrated circuitry (generally IC) and, e.g., of a sensor array is generated by mixing the two electronic functional parameters G and F by means of a mathematical mixing function, or combination function m(G, F). So that the inventive compensation for various piezo effects may be performed, the following general condition needs to be met, in accordance with the invention, in addition to the above precondition of identical functional-element stress influence functions, for the output signal of the integrated circuitry to become independent of stress:

$$\frac{\partial m(G, F)}{\partial f} = 0$$

which is equivalent to the following requirement:

$$\frac{\partial m/\partial G}{\partial m/\partial F} = -\frac{F_0(T)\,\pi_F(T)}{F_0(T)\,\pi_G(T)}$$

Independently of the above-mentioned requirement with regard to the independence of the output signal of stress, one may further obtain any thermal response of the output signal by multiplying the mixed function m(G, F) by a suitable scalar temperature-influence function t(T). From the above, latter equation it becomes clear that this temperature-influence function t(T) then drops out in the above ratio (dm/dG)/(dm/dF) because the temperature-influence function t(T) is present both in the numerator and in the denominator and thus is eliminated due to reduction.

If one does not want to make the output signal independent of stress, in a more general case, but wants to make it dependent on stress in accordance with a predefinable function s(f(σ),T), the condition $$m(G,F) = s(f(\underline{\sigma}),T)$$

is to be met, which is possible, in principle, since G and F are functions of T and f(σ).

This is how the inventive compensation for different piezo effects differs, when setting a thermal response desired, also from the temperature compensations known in the prior art. In the latter, only voltages, currents or Hall sensitivities and/or switch points are indeed temperature-compensated by mixing voltages or currents which are temperature-dependent to various degrees, but they are not stress-compensated.

The inventive approach including the introduction of a stress-influence function f(σ) results in the fact that the individual components of the stress tensor, which are actually to be considered for piezo compensation due to mechanical stress in the semiconductor material, need not all be considered individually, and that the output signal of the integrated circuitry and/or the above-mentioned mixed function thus need not be differentiated by the individual components of the stress tensor, but only by the stress-influence function introduced in accordance with the invention. In this connection it should be noted, in particular, that the inventive introduction of the stress-influence function in piezo compensation not only presents a mathematical transformation of the underlying problem, but also provides a completely new concept of piezo compensation which consists in that, starting from a scalar evaluation of the complex stress condition in the semiconductor material of the integrated circuitry, a suitable input quantity for the piezo compensation, i.e. a suitable input quantity for a piezo-compensation control loop, is obtained.

Minor deviations from the above equations are inevitable in practice, but it must be noted that the quality of the inventive piezo compensation is improved by as small deviations as possible.

This is why, in accordance with the invention, a so-called tolerance range is introduced for the stress dependence, or directional stress dependence of an electronic functional parameter of a semiconductor device. Thus, it is taken into account, in accordance with the invention, that the stress condition present on the surface of the integrated circuit is dependent on the base, i.e. it varies as the position on the semiconductor material varies. Therefore, the first and second functional elements are subject, strictly speaking, to different stress components. By taking suitable layout measures on the semiconductor circuit chip, as will be described below in detail within the framework of the specification of the present invention, attempts are now made at subjecting the first and second functional elements essentially to the same stress condition and also to the same temperature in the semiconductor material of the semiconductor circuit chips.

The inventive compensation concept accounts for this fact by enabling two different stresses, and thus two different directional stress dependencies, of the electronic functional parameters to occur at these two different locations, which, however, are identical within a certain tolerance range.

Concerning the tolerance range, it is also to be noted that in the art, there are deviations from the theoretical ideal case in all fields of physics, these deviations from the functionality of the inventive compensation concept needing to be sufficiently small only. If the deviations are, e.g., 10%, i.e. lie within a tolerance range of 10%, it will be possible to eliminate, with an otherwise ideal compensation, about 90% of the overall effect, i.e. of the influence of mechanical stresses present in the semiconductor material on the useful signal, or on the resulting output signal.

To be able to conduct effective stress compensation, the tolerance range should be smaller than 50%, preferably smaller than 10%, and, in the most preferred case, smaller than 1%.

In accordance with one aspect of the present invention, the different piezoresistive dependencies on resistors of varying technological architectures may be mixed in a suitable manner to thus obtain a piezo dependence of the combined total resistance and/or of a combined total current derived therefrom, it being possible, for example, to either set the resulting piezo dependence in a suitable manner, or to essentially eliminate it. To this end, the dependence of the resistance of the n- and p-doped reference resistors used on the mechanical stress is made, for example, non-directional by layout measures, so that the resistances of an n-doped reference resistor and a p-doped reference resistor (within a tolerance range) exhibit essentially the same directional dependence, and thus, therefore, the piezo dependencies of the two resistors may be combined, by simple combination, preferably a linear combination, so as to obtain the above-mentioned desired piezo dependence of the total resistance. For this purpose, reference currents are generated from the p- and n-doped resistors, respectively, both reference currents having a suitable ratio in accordance with the n-type piezoresistive dependence and the p-type piezoresistive dependence. By means of linear combination, e.g. summation or formation of difference, of both reference currents, which may be re-amplified and/or re-weighted, a total reference current is thus obtained which is independent, to a very large extent, on the mechanical stress exerted on the semiconductor chip, and/or which exhibits a desired, adjusted dependence on the mechanical stress exerted on the semiconductor chip.

To enable compensation for mechanical stress influences on the total current to be effected also across a wide temperature range, the thermal response of the ratio of n- to p-type reference currents may be selected in a suitable manner. In addition, it is also possible to set the thermal response of the total current (i.e. of the linear combination of n- and p-type reference currents) in any manner desired by making a suitable choice of the thermal response of a common pre-factor of the two n- and p-type reference currents.

In the present invention, use may also be made of so-called polysilicon resistors having a smaller stress dependence, and/or of metal, SiCr-, NiCr-resistors instead of the n-type resistors and/or p-type resistors, e.g. for the second conductivity type, it being essential only that their piezoresistive dependencies (piezo coefficients) differ with regard to the piezoresistive dependencies (piezo coefficients) of the resistive element of the first conductivity type, so that two different isotropic piezoresistive partial signals, e.g. partial voltages or partial currents, may be generated from the different resistor elements.

In addition, it should be noted that so-called magnetoresistive elements, such as AMR elements (AMR=anisotropic magnetoresistance) and/or GMR elements (GMR=giant magnetoresistance) may also be used. In this case, the electronic functional parameter of an AMR element is constituted by the anisotropic magnetoresistive effect which may be influenced by piezo effects and, in particular, the piezoresistive effect. The electronic functional parameter of a GMR element is formed by the giant magnetoresistive effect which is also influenced by piezo effects and, in particular, the piezoresistive effect.

In accordance with a further aspect of the present invention, it is possible, in accordance with the invention, with an integrated Hall-probe circuitry, to compensate, e.g., the piezo Hall effect, which has an impact on the magnetic current-related sensitivity of the Hall element, by means of the piezoresistive effect, which has an impact on the resistance of integrated reference resistors. To this end, in accordance with the invention, the dependence of the magnetic sensitivity of the Hall probe as well as of the resistance of the n- and p-doped reference resistors used on the mechanical stress is preferably made non-directional by means of layout measures.

Directional independence of the magnetic sensitivity of the Hall probe and of the resistance of the n- and p-doped reference resistors used of mechanical stress is achieved, in the semiconductor material, by layout measures, wherein the Hall probe and the reference resistor(s) are arranged, geometrically, on the semiconductor chip such that the piezo Hall effect of the Hall probe and the piezoresistive effect of the reference resistor(s) exhibit essentially the same directional dependence.

In accordance with the invention, the combined total current of the two n- and p-reference currents may now be impressed onto the Hall probe having the negative piezo Hall stress dependence, it being possible to compensate for the piezo Hall dependence of the Hall probe by means of the set piezoresistive dependence of the overall reference current of the Hall probe.

To enable compensation for the mechanical stress influences exerted on the magnetic sensitivity of the Hall probe also across a wide temperature range of the Hall probe, the thermal response of the ratio of n- to p-type reference currents may be selected in a suitable manner. This is possible since the thermal response of the magnetic sensitivity of the Hall probe may be set, independently thereof, by a correct choice of the thermal response of the common prefactor of the two n- and p-type reference currents.

In connection with Hall-probe arrangements it should also be noted that voltage control of the Hall probe is also possible, the voltage control of the Hall probe, wherein the Hall probe has no operating current $I_H$ (control current) impressed on it, but has an operating voltage (control voltage) applied to it, is, in this sense, equivalent to current control, it having to be said that with voltage control, the Hall probe, i.e. the resistor of the Hall probe, at the same time is also identical with the reference resistor (for generating operating current $I_H$).

A further inventive aspect is only the fact that, in accordance with the invention, the piezojunction effect, e.g. of vertical bipolar transistors in a {100} semiconductor material, e.g. {100} semiconductor material, may be compensated with the piezoresistive effect of two resistors exhibiting varying stress sensitivities. To this end, by means of layout measures, the stress sensitivity of the base-emitter voltage $V_{BE}$ of a bipolar transistor, and the stress sensitivity of the resistances of the n- and p-doped reference resistors used are made to be directionally independent of mechanical stress, and/or a suitable directional dependence is set, so that the piezojunction effect of the vertical bipolar transistor, and the piezoresistive effect of the two resistors of differing stress sensitivities exhibit essentially the same directional dependence. This is achieved, for example, by a 90° arrangement (L layout) of partial resistors and/or p-doped resistors having a ±45° alignment to the primary flat, and/or n-doped resistors having a 0° or 90° alignment to the primary flat.

Subsequently, reference currents are generated, respectively, from the p-doped resistor and the n-doped resistor, both reference currents having a suitable, adjustable relationship toward one another. The sum or difference of both, possibly weighted, currents or voltages from the resistors, which may be re-amplified, is then impressed into a bipolar transistor or compensated with the stress-sensitive base-emitter voltage of a bipolar transistor. To enable, for example, a compensation for mechanical stress influences on the constant voltage of a bandgap circuit across a wide temperature range, the thermal responses of both n- and p-reference currents should be suitably selected from the n-doped and p-doped reference resistors, this being achieved, for example, by sum or difference formation of portions of the base-emitter voltage $V_{BE}$ and portions of the temperature voltage $V_{PTAT}$ for the current flowing through the bipolar transistor.

In accordance with this aspect of the present invention, a first voltage is thus applied to a resistive p-type element, and a first current is decoupled, and a second voltage is applied to a resistive n-type element, and a second current is decoupled. Both currents are combined, e.g. subtracted in the (100)-Si plane, and the result current is fed to a bipolar transistor or used as a correction voltage. If need be, i.e. if corresponding parameters result in a plane different from the (100)-Si plane, these may possibly be added as well.

The above combination of the reference signals may also be performed by a summation or formation of difference with voltages generated across two different types of resistors. In addition, non-linear stress dependencies may also be compensated, in accordance with the invention, from these voltages or currents with the aid of non-linear circuits. Input quantities for the non-linear circuit are again voltages or currents generated from two different types of resistors.

The above-mentioned aspect of compensating for the piezojunction effect of a bipolar transistor with the piezoresistive effect of two resistors having differing stress sensitivities, may be advantageously applied, for example, for rendering a temperature sensor stress-insensitive by rendering the reference signal, i.e. the reference voltage or the reference current, of the temperature sensor stress-insensitive in accordance with the procedure presented above.

BRIEF DESCRIPTION OF THE DRAWINGS

Preferred embodiments of the present invention will be explained below in more detail with reference to the accompanying figures, wherein:

FIG. 1 is a circuitry on a semiconductor circuit chip for compensating piezo influences in accordance with a first embodiment of the present invention;

DESCRIPTION OF PREFERRED EMBODIMENTS

To facilitate understanding of the following detailed description of the inventive circuitry on a semiconductor circuit chip for compensating for different piezo effects, what follows initially is a brief representation, with regard to FIGS. 7a-c, of the definitions used below regarding the semiconductor material used and the predefined directions on same with regard to the crystal alignment of the semiconductor material.

To produce integrated circuits, the semiconductor wafers, e.g. silicon wafers, must be sawn off, from a monocrystal rod, such that the wafer surface is associated with a crystallographic plane. To determine the respective plane in a cubic crystal, the so-called Miller indices are used, which are indicated in round brackets below. For example, FIG. 7a shows a plan view, for example, of a semiconductor wafer cut in the (100) plane.

Figure 7A:
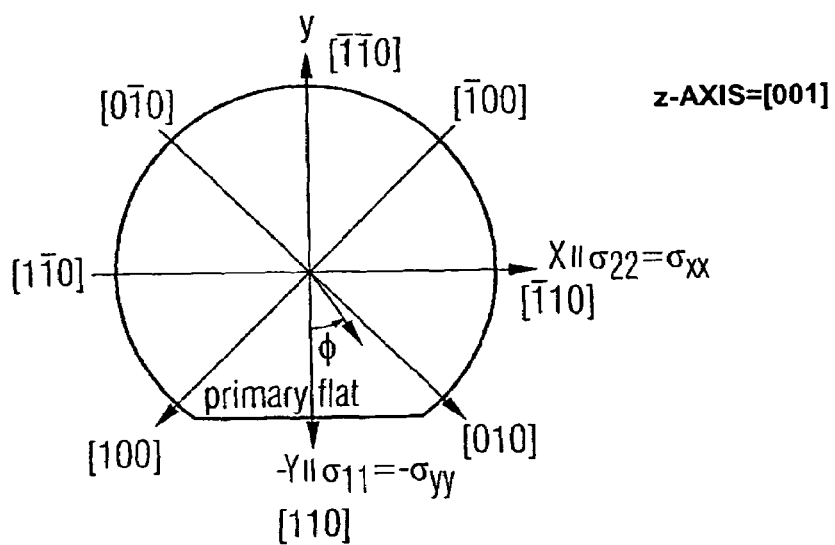
FIGS. 7a-c depict general definitions of the crystallographic directions in the plane (wafer plane) of a semiconductor material.
Figure 7B:
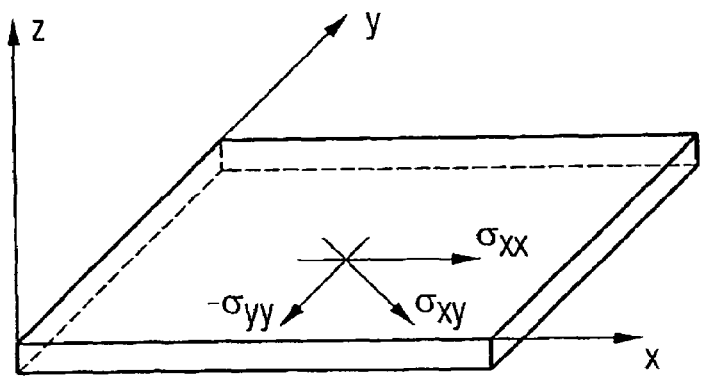
Figure 7C:
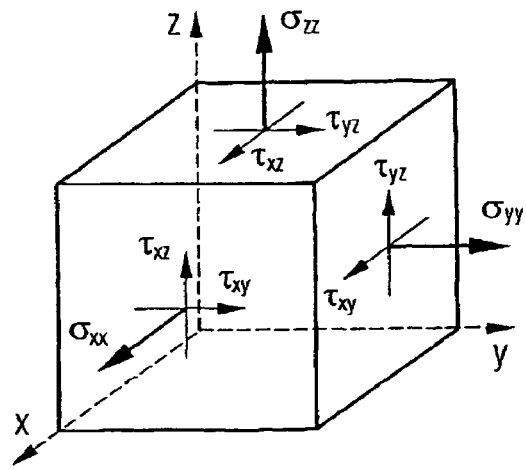

In addition, the main crystallographic directions in the wafer plane are marked in FIGS. 7a-c, the producers of these silicon wafers providing a so-called "primary flat" at the silicon wafer. Usually the edges of the rectangular geometries of the circuit structures on the semiconductor chip extend in parallel with and/or perpendicularly to the primary flats. In FIG. 7a, in particular, the crystallographic directions and/or axes are represented in the plane of the semiconductor wafer, these being represented in square brackets below. The coordinate system is usually employed such that the [110] direction extends perpendicularly to the primary flat, whereas the [$\bar{1}$10] direction extends in parallel with the primary flat. The directions [010] and [100] here extend at an angle of +/−45° in relation to the [110] direction.

In addition, an angle $\phi$ is defined in relation to the [110] direction, the angle $\phi$ being counted in an anti-clockwise manner, starting from the [110] direction, in a plan view of the topside of the wafer. Usually, the individual chips are positioned at the wafer such that the directions $\phi=0°$ and $\phi=90°$ correspond to the IC vertical and horizontal directions, respectively, it being possible that these directions are exchanged, depending on whether the IC is provided vertically of horizontally. The direction $\phi=90°$ will be referred to below as the x-axis ([$\bar{1}$10] direction), and the direction $\phi=0°$ will be referred to as the negative y-axis ([110] direction) below.

Since a {100} silicon material is used in the plurality of applications for integrated semiconductor circuitries, the following illustrations mainly relate to the numerical values for {100} silicon material, which are relevant to this material, in order to simplify the explanations and due to the special practical significance thereof. However, it should be obvious that, accordingly, other semiconductor materials and/or other silicon materials may also be used.

With reference to FIG. 1, an inventive circuitry 10 on a semiconductor circuit chip will be discussed, by way of example, below in accordance with the present invention, the essential basics of piezo effects in semiconductor materials being explained to further an understanding of the present invention.

As is shown in FIG. 1, circuitry 10 includes a first functional element 12 and a second functional element 14. The first functional element 12 exhibits an output terminal 12a for providing a first output signal 16. The second functional element 14 exhibits an output terminal 14a for providing a second output signal 18. A combination means 20 having first and second input terminals 20a, 20b and an output terminal 20c is arranged between output terminal 12a of first functional element 12, and output terminal 14a of second functional element 14. Combination means 20 is provided for combining or mixing (and, optionally, processing) the first and second output signals 16, 18 so as to provide a resulting output signal 22 at output terminal 20c.

In accordance with the present invention, the combining and/or mixing of the first and second output signals 16, 18 may optionally also comprise injecting the first output signal 16 of the first functional element 12 into the second functional element 14, the resulting output signal 22 then being obtained as an output signal of the second functional element 14.

As is represented in FIG. 1, the first functional element 12 is subject to a mechanical stress $\sigma_1$ and to an ambient temperature $T_1$, the second functional element 14 being subject to a mechanical stress $\sigma_2$ and a temperature $T_2$. In the preferred case, the first functional element 12 and the second functional element 14 are arranged, on the semiconductor circuit chip, so as to be subject, e.g., to the same mechanical stress $\sigma$ and the same ambient temperature T, within a tolerance range. To this effect, the first functional element 12 and the second functional element 14 are preferably arranged, in the layout, so as to be directly adjacent to one another, on the semiconductor circuit chip, and preferably interlaced on the semiconductor circuit chip.

As is also depicted in FIG. 1, the first functional element 12 comprises a first electronic functional-element parameter $F(T,\sigma)$, and the second functional element 14 comprises a second electronic functional-element parameter $G(T,\sigma)$. The functional-element parameter F of the first functional element 12 is influenced by the mechanical stress $\sigma$ and the temperature T in the semiconductor material, the second functional-element parameter G of the second functional element 14 preferably being subject to the same mechanical stress $\sigma$ and the same temperature T (within a tolerance range) in the semiconductor material of the semiconductor circuit chip. Thus, one obtains, in accordance with FIG. 1, a piezo dependence of the electronic functional-element parameter F of the first functional element 12 as a product of a temperature-dependent piezo influence factor $\pi_F(T)$ and any scalar function desired of the stress tensor $f(\cdot)$, which may also be non-linear, in the following form:

$$F(T)=F_0(T)(1+\pi_F(T)f(\underline{\sigma})),$$

with $f_F(\underline{\sigma})=0$ if $\underline{\sigma}=\underline{0}$

The scalar function of the stress tensor $f_F(\underline{\sigma})$ will be referred to below as a so-called piezo influence function and/or "functional-elementstress influence function" of the functional-element parameter F(T). The piezo dependence of the electronic functional parameter G of the second functional element 14 may also be represented as a product of a temperature-dependent piezo influence factor $\pi_G(T)$ and any scalar function desired (which may also be non-linear) of the stress tensor $f_G(\underline{\sigma})$, it being true that $$G(T)=G_0(T)(1+\pi_G(T)f_G(\underline{\sigma}))$$

with $f_G(\underline{\sigma})=0$ if $\underline{\sigma}=\underline{0}$ the inventive compensation for different piezo effects may be performed.

Initially, there is a precondition that the functional-element stress influence functions are rendered identical by configuring the functional elements in a suitable manner:

$$f_F(\underline{\sigma})=f_G(\underline{\sigma}),$$

so that we only need to speak of a functional-element stress influence function $f(\underline{\sigma})$, below.

The output signal of the integrated circuitry is generated by mixing the two electronic functional parameters G and F by means of a mathematical mixing function m(G, F), the following general condition having to be met, to this effect, in accordance with the present invention, for the output signal of the integrated circuitry to become independent of stress:

$$\frac{\partial m(G,F)}{\partial f}=0$$

which is equivalent to the following requirement:

$$\frac{\partial m/\partial G}{\partial m/\partial F}=-\frac{F_0(T)\,\pi_F(T)}{F_0(T)\,\pi_G(T)}$$

If, in the more general case, one does not want to make the output signal independent of stress, but wants to make it dependent on stress in accordance with a predefinable function $s(f(\underline{\sigma}),T)$, the following condition is to be met in accordance with the invention:

$$m(G,F)=s(f(\underline{\sigma}),T)$$

which is possible, in principle, since G and F are functions of T and $f(\underline{\sigma})$.

The mode of operation of the integrated circuitry, depicted in FIG. 1, on a semiconductor circuit chip for compensating for piezo influences in accordance with the present invention will be explained in detail below.

Within the framework of the present invention, mechanical stresses present in a semiconductor material are to mean purely mechanical stresses as are described by a mechanical stress tensor. The stress condition present in a semiconductor material is generally very complex to depict, since for the mechanical stress tensor there are generally nine components, i.e. three normal, or direct, stress components and six shear stress components, as is diagrammatically depicted in the xyz coordinate system with regard to FIG. 7c. Here, two shear stress components, respectively, are identical, so that only three different shear stress components occur.

Since an integrated circuit chip is generally structured in a layered manner in the packaged state, a limitation to the planar stress condition is possible, namely a limitation to two normal stress components $\sigma_{xx}$, $\sigma_{yy}$ and one shear stress component $\sigma_{xy}$, as is depicted by way of example with reference to FIG. 7b. In accordance with the definition, the x- and y-axes are arranged in parallel with the edges of the semiconductor circuit chip. The remaining stress components are essentially negligibly small and only have a minor influence on the electronic circuit components. At a sufficiently large distance from the edge of the semiconductor circuit chip, and in particular in the center of a semiconductor circuit chip, the shear stress component $\sigma_{xy}$ mostly is also negligibly small. Thus, this essentially leaves only the two normal stress components $\sigma_{xx}$ and $\sigma_{yy}$.

In the {100} silicon semiconductor material, which is used for the most part, the x-axis is, in accordance with the above definition, parallel with the [$\bar{1}$10] direction, and the y-axis is parallel with the [$\bar{1}\bar{1}$0] direction.

The electronic functional parameters of various integrated devices and/or semiconductor devices show, in {100} silicon, the dependencies, which will be explained in detail below, on the normal stress components $\sigma_{xx}$ and $\sigma_{yy}$ presented above.

Initially, a detailed description will be given below of resistive elements, such as resistor elements, MOS-FETs, etc. and, in particular, of the influence of the piezoresistive effect on the resistance of a resistive element.

If the mechanical stress exerted on the semiconductor circuit chip changes, the resistance changes in accordance with the following equation as a result of the piezoresistive effect:

$$\delta R=\frac{\Delta R}{R}=\frac{R(\sigma)-R(\sigma=0)}{R(\sigma=0)}$$

If MOS field-effect transistors are operated at an invariable gate-source voltage (i.e. as a current source), their drain current also changes as a result of the piezoresistive effect with $$\delta I=\frac{\Delta I}{I}=\frac{I(\sigma)-I(\sigma=0)}{I(\sigma=0)}$$

The alignment of a resistor element on the semiconductor chip is indicated as an angle $\phi$ in relation to the [110] direction in the crystal. The [110] direction is perpendicular to the primary flat of the semiconductor wafer and is thus defined in an unambiguous manner (cf. FIG. 7a).

The scientific publication [6] "CMOS Stress Sensors on (100) Silicon", by R. C. Jaeger et. al., IEEE JSSC, Vol 35, No. 1, January 2000, pp. 85-94, gives the following formula, which reflects the dependence of a diffusion/implantation resistor on the mechanical stress condition in a semiconductor material:

$$R(\sigma_{i,j},\phi)=R_0\Big[1+\Big(\frac{\pi_{11}+\pi_{12}+\pi_{44}}{2}\sigma'_{11}+$$
$$\frac{\pi_{11}+\pi_{12}-\pi_{44}}{2}\sigma'_{22}\Big)\cos^2\phi+$$
$$\Big(\frac{\pi_{11}+\pi_{12}-\pi_{44}}{2}\sigma'_{11}+\frac{\pi_{11}+\pi_{12}+\pi_{44}}{2}\sigma'_{22}\Big)\sin^2\phi+$$
$$\pi_{12}\sigma'_{33}+(\pi_{11}-\pi_{12})\sigma'_{12}\sin(2\phi)\Big]$$

The normal stress component $\sigma'_{11}$ lies in the wafer plane and points in the [110] direction ($\phi=0°$), the normal stress component $\sigma'_{22}$ lies in the wafer plane and points in the [$\bar{1}$10] direction ($\phi=90°$), and the normal stress component $\sigma'_{33}$ points, in a normal (perpendicular) manner, to the wafer plane in the [001] direction. In addition, the shear stress present in the wafer plane is referred to as $\sigma'_{12}$.

The change in the resistance of the resistive element due to the mechanical stresses is fully described by means of the three piezoresistive coefficients $\pi_{11}$, $\pi_{12}$, $\pi_{44}$. As has already been mentioned above, angle $\phi$ represents the angle present between the direction of current flow through the resistor, and the [110] direction at the wafer, the angle being positively counted in an anti-clockwise manner when viewing the top of the wafer. Therefore, the following results from the transformation equations of the planar stress condition in a semiconductor circuit chip (cf. FIG. 7a-b)

$\sigma'_{11}=\sigma_{yy}$, $\sigma'_{22}=\sigma_{xx}$, as well $\sigma'_{12}=-\sigma_{xy}$ If the mechanical stress tensor is transformed into the coordinate system of the resistor, the following relationship may be inferred from the above formula:

$\delta R = \pi_{long}\sigma_{long} + \pi_{trans}\sigma_{trans} + \pi_{shear}\sigma_{shear} + \pi_{12}\sigma_{zz}$ with:

$\pi_{long}=(3\pi_{11}-\pi_{12}-\pi_{44})\sin^2\phi\cos^2\phi+0.5\times(\pi_{11}+\pi_{12}+\pi_{44})(\sin^4\phi+\cos^4\phi)$ $\pi_{trans}=(-\pi_{11}+3\pi_{12}+\pi_{44})\sin^2\phi\cos^2\phi+0.5\times(\pi_{11}+\pi_{12}-\pi_{44})(\sin^4\phi+\cos^4\phi)$ $\pi_{shear}=0.5\times(\pi_{11}-\pi_{12}-\pi_{44})\sin 4\phi$ What follows now is what eventually results for the 4 important directions at the wafer:

$$\delta R[100] = -\delta I[100] = \frac{\pi_{11}+\pi_{12}}{2}\sigma_{xx} + \frac{\pi_{11}+\pi_{12}}{2}\sigma_{yy} + (\pi_{11}-\pi_{12})\sigma_{xy} + \pi_{12}\sigma_{zz}$$

$$\delta R[010] = -\delta I[010] = \frac{\pi_{11}+\pi_{12}}{2}\sigma_{xx} + \frac{\pi_{11}+\pi_{12}}{2}\sigma_{yy} - (\pi_{11}-\pi_{12})\sigma_{xy} + \pi_{12}\sigma_{zz}$$

$$\delta R[110] = -\delta I[100] = \frac{\pi_{11}+\pi_{12}-\pi_{44}}{2}\sigma_{xx} + \frac{\pi_{11}+\pi_{12}+\pi_{44}}{2}\sigma_{yy} + \pi_{12}\sigma_{zz}$$

$$\delta R[\bar{1}10] = -\delta I[\bar{1}00] = \frac{\pi_{11}+\pi_{12}-\pi_{44}}{2}\sigma_{xx} + \frac{\pi_{11}+\pi_{12}+\pi_{44}}{2}\sigma_{yy} + \pi_{12}\sigma_{zz}$$

Assuming that the x-axis is identical with the crystal direction [$\bar{1}$10], and that the y-axis is identical with the [$\bar{1}\bar{1}$0] crystal direction, this means, in particular, that the semiconductor circuit chip is produced from a {100} semiconductor material (preferably {100} silicon). Usually the primary flat is then parallel with the x-axis, so that the edges of the semiconductor circuit chip are parallel with the x- and y-axes. The crystal directions [100] and [010] then are identical with the diagonals of the semiconductor circuit chip (cf. FIG. 7b).

If two resistors which nominally are of identical size, but are rotated by 90° in the layout, are connected in series, the stress dependence may be reduced. The same applies to a parallel connection of two resistors rotated by 90°. The following relationships are obtained for the change in resistance:

$$\delta R([100]+[010]) = \frac{\pi_{11}+\pi_{12}}{2}\sigma_{xx} + \frac{\pi_{11}+\pi_{12}}{2}\sigma_{yy} + \pi_{12}\sigma_{zz} \cong \delta R([100]//[010])$$

$$\delta R([110]+[\bar{1}10]) = \frac{\pi_{11}+\pi_{12}}{2}\sigma_{xx} + \frac{\pi_{11}+\pi_{12}}{2}\sigma_{yy} + \pi_{12}\sigma_{zz} \cong \delta R([110]//[\bar{1}10])$$

Thus one recognizes from the above equations that both variants, i.e. series or parallel connection, are identical with regard to the resulting change in resistance due to a piezo effect. Additionally, the following is also true:

$\delta R([110]+[010])=\delta R([110]+[\bar{1}10])$, i.e. the series connection of two resistors orthogonal in the layout exhibits a behavior, with regard to mechanical stress, which is independent of a rotation of the entire arrangement by +/−45°. Such an arrangement will be referred to as an "L layout" below.

It may be recognized that $R(\sigma_{i,j},\phi)+R(\sigma_{i,j},\phi+90)$ becomes independent of $\phi$. This goes to show that the piezoresistive effect of an L layout is non-directional—i.e. "isotropic". However, since in an L layout the two orthogonal partial resistances are not perfectly identical in reality (due to insufficient matching), it is still advantageous to rotate the L layout such that the individual resistors of the L layout have only as small a piezoresistive dependence as possible. As has already been mentioned above, an n-type resistor has its smallest PR dependence for <110> directions, a p-type resistor has its smallest PR dependence for <100> directions.

The numerical values for the piezo coefficients indicated above may be taken, e.g., from the scientific publication [6], the following Table 1 representing the numerical values of the piezoresistive coefficients at room temperature with regard to n-type and p-type diffusion resistances.

TABLE 1

| Piezo coefficient | For n-type diffusion | For p-type diffusion |
|---|---|---|
| $\pi_{11}$ | −1.022 GPa$^{-1}$ | 0.066 GPa$^{-1}$ |
| $\pi_{12}$ | 0.534 GPa$^{-1}$ | −0.011 GPa$^{-1}$ |
| $\pi_{44}$ | −0.136 GPa$^{-1}$ | 1.381 GPa$^{-1}$ |
| $(\pi_{11}+\pi_{12})/2$ | −0.244 GPa$^{-1}$ | 0.028 GPa$^{-1}$ |
| $\pi_{11}-\pi_{12}$ | −1.556 GPa$^{-1}$ | 0.077 GPa$^{-1}$ |
| $(\pi_{11}+\pi_{12}+\pi_{44})/2$ | −0.312 GPa$^{-1}$ | 0.718 GPa$^{-1}$ |
| $(\pi_{11}+\pi_{12}-\pi_{44})/2$ | −0.176 GPa$^{-1}$ | −0.663 GPa$^{-1}$ |

The following customized quantity equations thus result from the above numerical values for the piezoresistive coefficients. The mechanical stress is inserted in giga-Pascal, and the relative change in resistance/current is obtained in terms of percentage.

The following applies to n-diffusion resistances:

$\delta R[100]=-\delta I[100]=-24.4\sigma_{xx}-24.4\sigma_{yy}-155.6\sigma_{xy}+53.4\sigma_{zz}$ $\delta R[010]=-\delta I[010]=-24.4\sigma_{xx}-24.4\sigma_{yy}+155.6\sigma_{xy}-53.4\sigma_{zz}$ $\delta R[110]=-\delta I[110]=-17.6\sigma_{xx}-31.2\sigma_{yy}+53.4\sigma_{zz}$ $\delta R[\bar{1}10]=-\delta I[\bar{1}00]=-31.2\sigma_{xx}-17.6\sigma_{yy}+53.4\sigma_{zz}$ $\delta R([100]+[010])=-24.4\sigma_{xx}-24.4\sigma_{yy}+53.4\sigma_{zz}\cong\delta R([100]//[010])$ $\delta R([100]+[\bar{1}10])=-24.4\sigma_{xx}24.4\sigma_{yy}+53.4\sigma_{zz}\cong\delta R([110]//\bar{1}10])$ The following applies to p-diffusion resistances:

$\delta R[100]=-\delta I[100]=2.84\sigma_{xx}+2.8\sigma_{yy}+7.7\sigma_{xy}-1.1\sigma_{zz}$ $\delta R[010]=-\delta I[010]=2.8\sigma_{xx}-2.8\sigma_{yy}-7.7\sigma_{xy}-1.1\sigma_{zz}$ $\delta R[110]=-\delta I[110]=-66.3\sigma_{xx}71.8\sigma_{yy}-1.1\sigma_{zz}$ $\delta R[\bar{1}10]=-\delta I[\bar{1}00]=71.8\sigma_{xx}-66.3\sigma_{yy}-1.1\sigma_{zz}$ $\delta R([100]+[010])=2.8\sigma_{xx}+2.8\sigma_{yy}-1.1\sigma_{zz}\cong\delta I([100]//[010])$ $\delta R([110]+[\bar{1}10])=2.8\sigma_{xx}2.8_{yy}-1.1\sigma_{zz}\cong\delta R([110]//[\bar{1}0]).$ Therefore it may be stated, by means of a summary, with regard to diffusion and/or implantation resistances on a semiconductor circuit chip, that the stress dependence of the resistance there additionally depends on the orientation of the resistor in the x-y plane of the semiconductor circuit chip, so that, in particular, not only the sum of the normal stress components is taken into account.

Alternatively, a so-called "L resistor array" of two resistors may be provided, i.e. one takes two resistors of equal size which are arranged such that they are perpendicular to one another and lie directly adjacently to one another, and electrically connects these resistors in series or in parallel. Here, the L resistor circuit may be rotated in any manner desired in the (100) plane without causing a change in its piezo properties and/or dependencies. This L resistor circuit is preferable to an individual resistor in a (100) direction, since the L resistor circuit is essentially unique in its insensitivity toward the shear stress component in the semiconductor material of the semiconductor circuit chip.

The following relationship is now obtained, from the above equations, for an L resistor circuit:

$$R_L = R_{L0}(T)\left(1 + \frac{\pi_{11}(T) + \pi_{12}(T)}{2}(\sigma_{xx} + \sigma_{yy})\right)$$

Factor $R_{L0}(T)$ indicates that resistance of the L resistor circuit with a vanishing mechanical stress in the semiconductor material of the semiconductor circuit chip. It should be noted, in this context, that the basic resistance $R_{L0}(T)$ is already temperature-dependent. In an L resistor arrangement, factors $\pi_{11}(T)$ and $\pi_{12}(T)$ are the only relevant terms of the piezoresistive tensor in the (100) plane. These two relevant terms of the piezoresistive tensor, in turn, also indicate a certain dependence on temperature.

It is essential to the present invention that in the above equation, only the "sum" of the two direct, or normal, stress components $\sigma_{xx}$ and $\sigma_{yy}$ is taken into account for the resistance of an L resistor circuit.

What is also to be noted with regard to the piezoresistive effect is that MOS field-effect transistors behave essentially like diffusion resistors with regard to their stress dependence, so that both implantation and diffusion resistors as well as MOS field-effect transistors are included in the term "resistive elements" within the framework of the present invention, the "resistive elements" being exposed to the piezoresistive effect, and their resistances exhibiting a piezoresistive dependence.

With regard to the piezoresistive effect, reference shall now be made to a specific form of resistor elements, namely to polysilicon resistors. Polysilicon resistors are not diffused and/or implanted into the monocrystal material of the semiconductor circuit chip, but are grown onto the semiconductor surface of the integrated semiconductor circuit chip. There is generally a dielectric between the monocrystal semiconductor material and the polysilicon run of the polysilicon resistor. The dependence of polysilicon resistors on stress is now no longer dependent on the direction of the polysilicon resistor run on the semiconductor surface due to the statistical directional distribution of the large number of individual grains in the poly-semiconductor material (polysilicon material). Thus, a polysilicon resistor exhibits a piezoresistive dependence which is essentially similar to that of an L resistor circuit of diffusion and/or implantation resistors.

What is referred to below is the influence of mechanical stresses in a semiconductor material on the Hall constant in the semiconductor material, this dependence being described by the piezo Hall effect. Because of the piezo Hall effect due to a mechanical stress σ in the semiconductor material of the semiconductor circuit chip, the current-related magnetic sensitivity $S_i$ of a Hall probe, in particular, is influenced in accordance with the following equation:

$S_i = S_{i0}(1 + P \times \sigma)$

Considering a planar stress condition in the semiconductor circuit chip of a Hall probe, and neglecting the shear stress component while the Hall probes are located at a sufficient distance from the edge of the semiconductor circuit chip, so that, in accordance with the invention, only the two normal stress components $\sigma_{xx}$, $\sigma_{yy}$ are required for describing the mechanical stress tensor, what results is the following current-related magnetic sensitivity $S_i$ of a Hall probe:

$S_i = S_{i0}(T)(1 + P_{12}(T)(\sigma_{xx} + \sigma_{yy}))$

In the above equation, factor $S_{i0}(T)$ represents the current-related magnetic sensitivity with a vanishing mechanical stress, it being notable here, too, that the basic value of the current-related magnetic sensitivity $S_{i0}(T)$ is already dependent on temperature. Factor $P_{12}(T)$ indicates the only relevant coefficient term of the piezo Hall tensor which, in turn, has a specific dependence on temperature. Even with a Hall probe in a semiconductor circuit chip, the result is thus that only the sum of the two normal stress components $\sigma_{xx}$ and $\sigma_{yy}$ is taken into account in the above formula for the current-related magnetic sensitivity $S_i$ of a Hall probe.

In addition to Hall probe arrangements, there are other magnetic-field sensors, such as MAG-FETs or magneto-diodes, all of these elements having the same property in that the charge carriers in the semiconductor material flowing in the magnetic-field sensor element are influenced by a magnetic field because of the Hall effect. All effects mentioned have piezo influences described by the piezo Hall coefficient or similar coefficients, i.e. the influence of mechanical stresses in a semiconductor material on the above-mentioned magnetic-field sensitive elements is, at any rate, not described by the piezoresistive effect alone.

The change in the saturation current $I_S$ of a bipolar transistor because of stress dependencies (piezojunction effect) may be phenomenologically modeled with a $2^{nd}$-order approximation:

$$\delta I_{S,ij} = \frac{\Delta I_{S,ij}}{I_{S0}} = \frac{I_{S,ij}(\sigma) - I_{S,ij}(0)}{I_{S,ij}(0)} = -\zeta_{ijkl}\sigma_{kl} - \zeta_{ijklmn}\sigma_{kl}\sigma_{mn}$$

wherein Einstein's summation convention applies (a summation is made via identical indices). What applies is as follows:

$1^{st}$-order piezojunction coefficients: $\zeta_{ijkl}$
$2^{nd}$-order piezojunction coefficients: $\zeta_{ijklmn}$
i . . . direction of the electrical field
j . . . direction of the current density
k, l . . . specifies the component of the $1^{st}$-order stress tensor m, n . . . specifies the component of the $2^{nd}$-order stress tensor All indices run from 1 to 3.

Taking into account the above equations with regard to the piezojunction effect on the characteristics of bipolar transistors, the following stress-dependent relationship may be obtained for the saturation current of a vertical bipolar transistor:

$$I_S = I_{S0}(T)\Big(1 - \zeta_{12}(T)(\sigma_{xx} + \sigma_{yy}) - \frac{2\zeta_{122}(T) + 2\zeta_{123}(T)}{4}(\sigma_{xx} + \sigma_{yy})^2 - \frac{\zeta_{144}(T)}{4}(\sigma_{xx} + \sigma_{yy})^2\Big)$$

Again, the basis is a planar stress condition in the semiconductor circuit chip, in which the vertical bipolar transistor is located, so that only the two normal stress components $\sigma_{xx}$, $\sigma_{yy}$ of the mechanical stress tensor are to be taken into account.

In the above equation for the stress-dependent saturation current of a vertical bipolar transistor, factor $I_{s0}(T)$ represents the basic value of the saturation current with vanishing mechanical stress in the semiconductor material of a semiconductor circuit chip. It should be noted that this basic value $I_{s0}(T)$ of the saturation current already exhibits a dependence on temperature.

The $\zeta$ factors are the relevant coefficient terms of the piezojunction tensor, wherein those $\zeta$ terms which have three indices (e.g. $\zeta_{122}$, $\zeta_{123}$, $\zeta_{144}$) are only of minor importance, since they reproduce only the non-linear portion of the stress-dependent saturation current of a vertical bipolar transistor, this non-linear portion being smaller than the linear term of the saturation current.

In the center of the IC, $\zeta_{144}$ is negligible, since the difference of the normal stresses $\sigma_{xx}-\sigma_{yy}$ is much smaller than the sum of the normal stresses $\sigma_{xx}+\sigma_{yy}$.

This results in the following simplified equation for the stress- and temperature-dependent saturation current of a vertical bipolar transistor:

$$I_S \approx I_{S0}(T)\Big(1 - \zeta_{12}(T)(\sigma_{xx} + \sigma_{yy}) - \frac{2\zeta_{122}(T) + 2\zeta_{123}(T)}{4}(\sigma_{xx} + \sigma_{yy})^2\Big)$$

With regard to the above equation, it should be noted, in the context of the present invention, that here, too, only the sum of the two normal stress components $\sigma_{xx}$, $\sigma_{yy}$ is taken into account.

Like with the piezoresistive effect discussed above, the numerical $\zeta$ values may be indicated here, these values stemming from the publication [7] "A new model of the effect of mechanical stress on the saturation current of bipolar transistors", by J. F. Creemer & P. J. Fruett, Sensors and Actuators A97-98 (2002) 289-295 Table 1 and Table 2:

TABLE 2

| Creemer & French | Piezojunction coefficients according to Creemer & French at room temperature | |
|---|---|---|
|  | Electrons in p-basis (NPN) | Holes in n-bases (PNP) |
| $\zeta_{11}$ | −28.4%/GPa ± 3.0 | +30.8%/GPa ± 2.6 |
| $\zeta_{12}$ | +43.4%/GPa ± 1.5 | +13.8%/GPa ± 1.3 |
| $\zeta_{44}$ | +13.1%/GPa ± 4.3 | +119.8%/GPa ± 4.2 |
| $\zeta_{122}$ | −129%/GPa^2 ± 21 | −121%/GPa^2 ± 23 |
| $\zeta_{123} + \zeta_{144}/2$ | +54%/GPa^2 ± 30 | −11%/GPa^2 ± 29 |
| $\zeta_{111} - 4\zeta_{616} + 2\zeta_{414} + 2\zeta_{456}$ | −150%/GPa^2 ± 100 | −170%/GPa^2 ± 130 |
| $\zeta_{112} + \zeta_{166}/2 - \zeta_{414} - \zeta_{456}$ | +30%/GPa^2 ± 43 | +99%/GPa^2 ± 53 |
| $\zeta_{123} - \zeta_{166} + 2\zeta_{616} + \zeta_{414} + \zeta_{456}$ | +160%/GPa^2 ± 100 | +30%/GPa^2 ± 130 |
| $\zeta_{144} + 2\zeta_{166} - 4\zeta_{616} + 2\zeta_{414} + 2\zeta_{456}$ | −210%/GPa^2 ± 210 | −70%/GPa^2 ± 260 |

With these numerical values, the following results for the piezojunction influence on the vertical PNP transistor (V-PNP) in the generally planar stress condition with an additional vertical stress:

$$\Delta I_S^{V-PNP}/I_{S0} = -13.8(\sigma_{xx}+\sigma_{yy})-30.8\sigma_{zz}+66(\sigma_{xx}+\sigma_{yy})^2+220\sigma_{xy}^2+?,$$

the "?" representing the remaining terms, the piezojunction coefficients of which are not determined in terms of numerals. In this customized quantity equation, the stress is to be inserted in Gpa, followed by the change in the saturation current in %.

What follows for the V-NPN is:

$$\Delta I_S^{V-NPN}/I_{S0} = -43.4(\sigma_{xx}+\sigma_{yy})+28.4\sigma_{zz}+37.5(\sigma_{xx}+\sigma_{yy})^2+366\sigma_{xy}^2+?$$

With regard to the inventive circuitry 10 on a semiconductor circuit chip, as represented in FIG. 1, it should be noted that each of the semiconductor devices represented above, i.e. the diffusion and/or implantation resistors, MOS field-effect transistors, polysilicon resistors, Hall probes, vertical bipolar transistors, lateral bipolar transistors, diodes, may be employed, in accordance with the invention, as the first or second functional elements 12 and 14, respectively.

With regard to lateral bipolar transistors in a semiconductor circuit chip it should be noted that they behave similarly to vertical bipolar transistors, lateral bipolar transistors, however, additionally exhibiting a dependence, with regard to piezo influences, on the direction of current flow through the transistor. Thus, corresponding assumptions may be made just like with diffusion and/or implantation resistors and MOS field-effect transistors, it being possible, in particular, to build an L structure of two lateral bipolar transistors whose directions of current flow are perpendicular to one another.

Thus, the stress-dependent resistance $R_L(\sigma,T)$ of resistive elements, the temperature-dependent, current-related magnetic sensitivity $S_I(\sigma,T)$ of Hall probes, and the saturation current $I_S(\sigma,T)$ of vertical bipolar transistors, which are influenced by mechanical stresses in the semiconductor material of the semiconductor circuit chip due to different piezo effects, may be regarded as the electronic functional parameter F(σ,T) of the first functional element 12, and the electronic functional parameter G(σ,T) of the second functional element 14, respectively.

With regard to Hall probes, it should also be mentioned, in particular, that Hall probes may not only be driven by current control, but that voltage control of the Hall probe is also possible. Thus, no operating current needs to be impressed in the Hall probe, but an operating voltage is applied which is, in this sense, equivalent to current control. This demonstrates that the Hall probe may at the same time also represent the reference resistor for generating the current flowing through the Hall probe.

Thus, a Hall probe may simultaneously form the first functional element 12 having the electronic functional parameter H(T) in the form of the stress-dependent resistance influenced by the piezoresistive effect, and the second functional element 14 having the stress-dependent, current-related sensitivity $S_i$(T) influenced by the piezo Hall effect.

In accordance with the present invention, a piezo effect acting on the second functional element 14 may be compensated for by a piezo effect acting on the first functional element 12 if the electronic functional parameters F(σ,T) and G(σ,T) of the first and second functional elements 12 and 14, influenced by the respective piezo effects, exhibit essentially identical (within a predefined tolerance range) directional dependencies with regard to the stress components to be considered of the mechanical stress tensor.

The preconditions necessary for compensating for different piezo effects will generally be presented below.

The inventive compensation for piezo influences on a semiconductor circuit device by combining various piezo effects is achieved in that preferably two semiconductor devices, which are formed to be immediately adjacent to one another, if possible, on a semiconductor circuit chip, are arranged, geometrically, such that the piezo influences on the two electronic functional parameters influenced by piezo effects have the same, within a tolerance range, directional dependencies, or are non-directional. This enables obtaining a mutual compensation for the impact, caused by various piezo effects, on the electronic functional parameters of the electronic semiconductor devices by means of a simple combination of the various piezo influences, e.g. by means of a simple linear combination of same.

It also becomes clear that for performing a stress compensation by means of a Hall probe and/or a bipolar transistor and/or a diffusion and/or implantation resistor it is required, in accordance with the invention, to configure the respective semiconductor devices such that the relevant piezo dependencies exhibit essentially matching directional dependencies and preferably include only a linear combination, e.g. sums or difference terms, of both normal stress components, as has been described with regard to the electronic semiconductor devices presented above.

With regard to the above discussions of the various semiconductor devices and their stress dependencies, it should be noted that they were performed with regard to a {100} silicon semiconductor material. With other silicon starting materials and/or semiconductor starting materials, such as (111) silicon, the statements made above about the dependence of the electronic functional parameters F(T) and G(T) on the sum of the normal stress components of the mechanical stress tensor do not apply in an identical manner. However, it should be noted that in accordance with the present invention, with a corresponding L layout, e.g. of diffusion and implantation resistors, as well as with the choice of the suitable current directions in the (111) plane of the (111) silicon material, stress-dependencies of the piezo effects exclusively on the sum or exclusively on the difference of the normal stress components may again be achieved.

It should also be noted that a linear connection of the stress components and, in particular, of the normal stress components of the mechanical stress tensor with regard to the stress-dependencies of the piezo effects is essentially not required, so that, like in the above example of the piezojunction effect in a {100} silicon material, higher-order terms of the directional components of the mechanical stress tensor, e.g. $((\sigma_{xx}+\sigma_{yy})^2$ or $((\sigma_{xx}-\sigma_{yy})^2$, may also occur as long as exclusively additive and/or subtractive relations (linear combinations) occur between the normal stress components $\sigma_{xx}$ and $\sigma_{yy}$ as well as their powers.

Figure 2A:
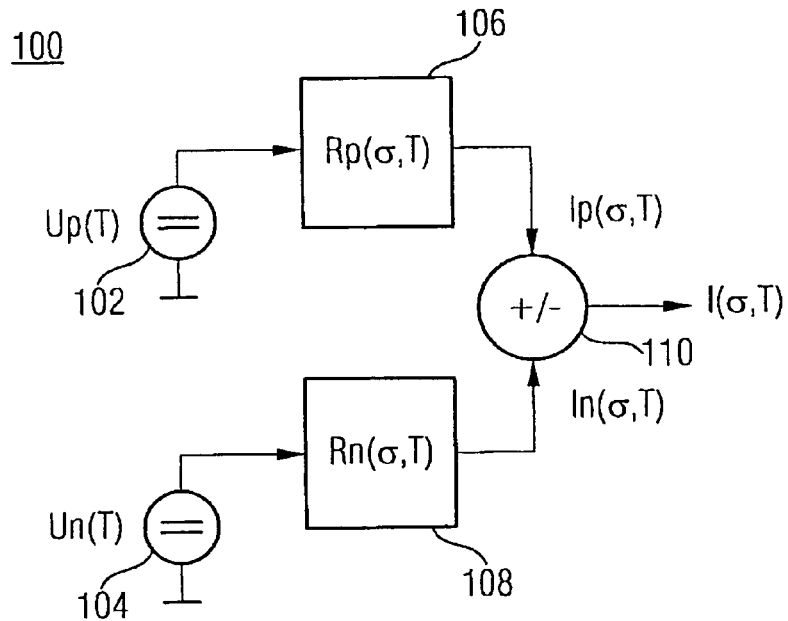
FIGS. 2a-b are a fundamental representation and a representation of an exemplary realization, respectively, of an arrangement for combining two signals subject to differing piezo influences.
Figure 2B:
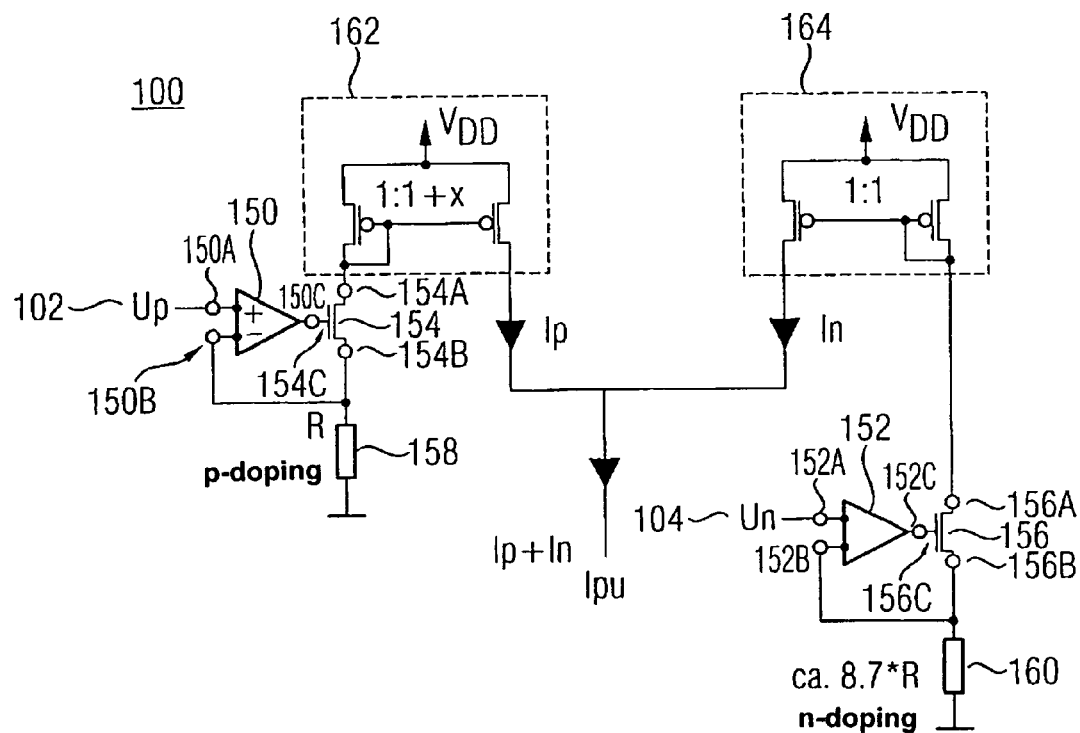

With reference to FIGS. 2a-b, a potential practical realization of the inventive circuitry 10, as depicted in FIG. 1, will be explained below.

Circuitry 100 of FIG. 2a includes a first voltage source 102 for providing a first input voltage $U_p$(T), and a second voltage source 104 for providing a second input voltage $U_n$(T), a first resistive p-type element 106 with a resistance $R_p$(σ,T), and a second resistive n-type element 108 having a resistance $R_n$(σ,T) and a combination means 110.

In accordance with the invention, the mode of operation of the circuitry 100 depicted in FIG. 2a consists in applying a first voltage $U_p$(T) of the voltage source 102 to a first resistive p-type element 106, and decoupling a first current $I_p$(σ,T). By means of the voltage source 104, a second voltage $U_n$(T) is applied to the second resistive n-type element 108, and a second current $I_n$(σ,T) is decoupled. Both currents $I_p$(σ,T) and $I_n$(σ,T) are combined in the combination means 110, e.g. added or subtracted, so that the result current and/or total current I(σ,T) is available at the output of combination means 110.

It should be noted that if need be, i.e. if the respective electronic functional parameters of the first and second resistive elements exhibit directional stress dependencies differing from the (100) silicon plane, the combination means 110 may also be subtracted and/or subject to a different combination function so as to obtain the result current I(σ,T) which is essentially independent of piezo influences and/or which exhibits a set resulting stress dependence due to a piezo effect.

A potential technical realization of the fundamental circuitry 100 depicted in FIG. 2a will be discussed below with reference to FIG. 2b.

As is depicted in FIG. 2b, circuitry 100 includes a first operational amplifier 150 having a first input terminal 150a, a second input terminal 150b and an output terminal 150c, a second operational amplifier 152 having a first input terminal 152a, a second input terminal 152b and an output terminal 152c, a first field-effect transistor 154 having a first terminal 154a, a second terminal 154b and a control terminal 154c, a second field-effect transistor 156 having a first terminal 156a, a second terminal 156b and a control terminal 156c, a p-type resistor 158 and an n-type resistor 160, a first current mirror circuit 162 and a second current mirror circuit 164.

The circuit elements are connected as depicted in FIG. 2b.

A first input voltage $U_p$ is applied at the first input terminal 150a of the first operational amplifier 150, and a second input voltage $U_n$ is applied at the first input terminal 152a of the second operational amplifier 152.

The mode of operation of the circuitry 100 depicted in FIG. 2b will be explained in detail below.

The basic idea underlying circuitry 100 of FIG. 2b is that two partial currents $I_p$ and $I_n$, which are obtained as resistive elements from the n-type resistor 160 and the p-type resistor 158, MOS field-effect transistors also being conceivable as resistive elements, are mixed in a suitable ratio so that the influence of the piezoresistive effect on the resistance of the first and second resistive elements 158, 160 and, thus, on the first and second currents $I_p$ and $I_n$, is compensated for, and/or so that a resulting stress dependence of the total current $I_{pn}$ is generated so as to compensate for, e.g., a different piezo effect and/or a different stress dependence, as will be explained below in more detail with reference to further embodiments.

To this end, it is important, initially, for both resistors 158, 160 to be exposed to essentially the same mechanical stress in the semiconductor material of the semiconductor circuit chip. This is best achieved by placing the resistive elements 158, 160 in the circuit layout so as to be as close together as possible, and by ideally interlacing them with one another, e.g. in the order n-type resistor—p-type resistor—n-type resistor. In addition, the resistive elements 158, 160 are preferably placed in the center of the semiconductor circuit chip, since it is there that the mechanical stress acting on these resistive elements 158, 160 is as homogeneous as possible, so that the adjacent resistive structures are subjected, as far as possible, to the same mechanical stress.

In addition, it is necessary, in realizing circuitry 100 depicted in FIG. 2b, that directional dependencies with regard to the piezoresistive effects on the resistive elements 158, 160 are taken into account. If individual elements are used for the resistive elements 158 and 160, the compensation for the piezo effect in the resulting total current $I_{pn}$ may be performed only for a specific, predefined direction because of the directional dependence of the piezo influences on the resistive elements 158, 160. However, since one does not know, in practice, in which direction the mechanical stress will occur at the semiconductor circuit chip, and/or since this direction may change due to assembly tolerances as well as retro-fitting of the integrated circuit chip into a circuit module, such a compensation cannot be performed in a sufficiently reliable manner. This is why, in accordance with the present invention, the directional dependence of the piezo effects on the first and second resistive elements 158 and 160 is eliminated in a first step. To cause a resistance of the resistive elements 158 and 160 to become independent of the direction of the mechanical stress in the chip plane, which occurs in the semiconductor material of the semiconductor circuit chip, two resistive elements which are nominally equal in quantity (with regard to their resistances) are used, in accordance with the invention, which are disposed in a mutually perpendicular manner in the circuit layout in the chip plane and are electrically connected in series or in parallel. The resulting overall resistance of the resistive element 158, which consists of two resistive elements arranged in a mutually perpendicular manner, and of the resistive element 160, which consists of two resistive elements arranged in a mutually perpendicular manner, then is independent of the respective direction in which the mechanical stress occurs in the chip plane.

A further possibility of eliminating the directional dependence of piezoresistive effects is to make a current flow through a resistor, e.g. the resistive elements 158 and/or 160, in one direction in a first clock interval, and in an orthogonal direction in a second clock interval, and to perform temporal averaging.

In a {100} silicon semiconductor material, what is relevant to the piezoresistive effect are mainly the piezoresistive coefficients $\pi_{11}$, $\pi_{12}$ as well as the normal stress components $\sigma_{xx}$, $\sigma_{yy}$, in the plane of the chip surface. The following applies to n-doped resistors in the L layout:

$$\pi_n = (\pi_{11} + \pi_{12})/2 = -24.4\%/\text{GPa}$$

The following applies to p-doped resistors in the L layout:

$$\pi_p = (\pi_{11} + \pi_{12})/2 = +2.8\%/\text{GPa}$$

By mixing the resistances of p- and n-doped resistors in a suitable manner and/or by mixing the currents, obtained by means of these resistors, in a suitable manner, a total current $I_{np}$ may be produced which exhibits no and/or an exactly desired dependence on the mechanical stress in the semiconductor material of the semiconductor circuit chip.

As becomes obvious from the two above equations, the piezoresistive coefficient $\pi_n$ for an n-doped resistor is 8.7 times higher, in terms of quantity, that the piezoresistive coefficient $\pi_p$ for a p-doped resistor.

A series connection of an n-doped and a p-doped resistor will be referred to below. If the p-type resistor is 24.4/2.8=8.7 times higher than the resistance of the n-type resistor, the total resistance resulting from the series connection is independent of the mechanical pressure exerted on the (100) silicon chip. Generally, the following relationship applies to a piezo compensation for the series connection:

$$R_{0p}\pi_p + R_{0n}\pi_n = 0$$

A parallel connection of an n-doped and a p-doped resistor will be referred to below. If the resistance of the n-type resistor is 24.4/2.8=8.7 times higher than the resistance of the p-type resistor, the overall resistance resulting from the parallel connection is independent of the mechanical pressure exerted on the (100) silicon chip. However, it should be noted that this compensation effected by means of a parallel connection of an n-type resistor and a p-type resistor only applies near $\sigma_0=0$ due to the non-linearities in the formula of the total resistance. More generally speaking, the following relationship applies to a piezo compensation for the parallel connection of an n-type resistor and a p-type resistor for any basic stresses of the semiconductor chip in the package:

$$\frac{\pi_p}{R_{0p}(1+\pi_p \times \sigma_0)^2} + \frac{\pi_n}{R_{0n}(1+\pi_n \times \sigma_0)^2} = 0$$

With regard to compensating for piezoresistive effects in the semiconductor material of a semiconductor circuit chip by means of resistive elements, it should be noted, however, that both the resistances $R_p$ and $R_n$ of the p-type and n-type resistors and the piezo coefficients $\pi_p$ and $\pi_n$ generally change to varying degrees as the ambient temperature changes, so that a compensation changes, with a set resistance ratio, in dependence on the temperature.

It should also be noted that resistive elements in the form of integrated resistors are subject to considerable process scattering attaining an order of magnitude of 30% of the resistance, so that the realization of the compensation is frequently only insufficient in practice even with a nominally correct resistance ratio.

What follows is a discussion of how temperature compensation may be provided, in accordance with the invention, with regard to the above-mentioned problems, and of how a possibility of matching process tolerances may be implemented, this preferably being conducted in wafer testing.

Temperature compensation and matching of process tolerances may be preferably achieved, when working in the current range, by using resistors 158, 160 to generate currents $I_p$ and $I_n$. These currents $I_p$ and $I_n$ may be matched and mixed in accordance with the invention. With the conversion of a resistance of the resistive elements 158, 160 of FIG. 2b to a current $I_p$, $I_n$, a voltage is needed according to Ohm's law, i.e. the input voltages $U_p$, $U_n$ are needed. These input voltages $U_p$, $U_n$, may also be provided, in accordance with the invention, for temperature compensation.

Circuitry 100 depicted in FIG. 2b is a representation of an exemplary realization for temperature compensation and/or for matching process tolerances.

With regard to circuitry 100 depicted in FIG. 2b it shall initially be assumed that the input voltages $U_p$, $U_n$ are identical, i.e. $U_p = U_n$. The first input voltage $U_p$ is copied onto the p-doped resistor 158, having the resistance R, by means of the first operational amplifier 150 configured as a unity-grain amplifier, and by means of the nMOS field-effect transistor 154. The drain terminal 154a of the nMOS field-effect transistor 154 draws a current of a quantity $I_p$ toward ground.

The second input voltage $U_n$ is copied onto the n-doped resistor 160, having the resistance 8.7R, by means of the second operational amplifier 152, also configured as a unity-grain amplifier, and my means of the second nMOS field-effect transistor 156. The drain terminal 156a of the second nMOS field-effect transistor 156 draws a current of a quantity $I_n$ toward ground.

The first current $I_p$ is mirrored at the positive supply voltage $V_{DD}$ by the first current mirror circuit 162 consisting of pMOS transistors. Similarly, the second partial current $I_n$ is mirrored at the positive supply voltage $V_{DD}$ by the second current mirror circuit 164 consisting of pMOS field-effect transistors. Both mirrored currents $I_p$ and $I_n$ are combined in a simple manner, i.e. are added.

As is shown in FIG. 2b, the first current mirror circuit 162 has a current mirror ratio of 1:(1+x). The second current mirror circuit 164 has a ratio of 1:1. The partitioning of the current mirror ratios may, of course, also be switched accordingly between the first and second current mirror circuits 162, 164.

Assuming that the first input voltage $U_p$ and the second input voltage $U_n$ are identical, the detuning x of the first current mirror circuit 162 serves to level out process-related tolerances, i.e. process scattering, between n-type and p-type resistors. It should also become clear, of course, that the first and second input voltages $U_p$ and $U_n$ may be set to be different, and that this difference may be leveled out by a suitable ratio of the current mirror circuits 162, 164. Alternatively, it is also possible to make one of the two input voltages $U_p$, $U_n$ adjustable and to leave the two current mirror ratios of the current mirror circuits 162, 164 unchanged.

The total current $I_{pn}$ of circuitry 100 depicted in FIG. 2b is calculated by the following equation:

$$I = I_p + I_n = \frac{U_p}{R_{p0}(1 + \pi_p \times \sigma)} + \frac{U_n}{R_{n0}(1 + \pi_n \times \sigma)}$$

the parameters $R_{p0}$, $R_{n0}$, $\pi_p$, $\pi_n$ exhibiting a certain dependence on temperature, depending on technological details of the manufacturing process for the resistive elements 158, 160.

This dependence of the above parameters on temperature may be compensated for, for example, by means of input voltages $U_p$, $U_n$ by providing the first and second input voltages $U_p$, $U_n$ with a certain temperature dependence $U_p(T)$, $U_n(T)$. This results in two freely selectable parameters, i.e. the temperature dependence of the first and second input voltages $U_p(T)$, $U_n(T)$. Thus, two independent equations may be solved. The first equation describes the piezo compensation for arbitrary temperatures:

$$\frac{\partial I(\sigma_0)}{\partial \sigma} = 0 \; \forall \; T$$

The second equation is as follows:

$I(T)$=desired predefinable function of $T$

Since in a {100} silicon material the relevant piezoresistive coefficients have different signs for n-doped and p-doped resistors, a piezo-compensated total current $I_{pn}$ may be obtained by adding n- and p-currents $I_p$ and $I_n$ weighted in a suitable manner. In addition, it is of course also possible to obtain a total current $I_{pn}$ having a desired piezo dependence which is still present, by adding and/or subtracting n- and p-currents $I_n$, $I_p$ weighted in a suitable manner.

With regard to the above addition of n- and p-currents $I_p$, $I_n$ weighted in a suitable manner, it should also be noted that it is possible that in other crystal planes than with {100} silicon, the piezoresistive coefficients have a same sign for n-doped and p-doped resistive elements (resistors, MOS field-effect transistors), so that the above-described principle is altered to the effect that a difference of the two partial currents $I_p$ and $I_n$ is formed. This is depicted, in principle, in the combination means 110, shown in FIG. 2a, of circuitry 100.

It should be noted, with regard to the above explanations concerning the generation of currents $I_p$ and $I_n$, that these currents may also be obtained by means of pMOS and nMOS field-effect transistors. If ground potential and supply voltage potential are applied to the control terminal (gate terminal) of this pMOS field-effect transistor and this nMOS field-effect transistor, respectively, these potentials not only cause the operating point of the respective field-effective transistor to be placed in the linear range, but these potentials are also effective as the input voltages $U_p$ and $U_n$.

The thermal responses of the drain currents of both MOS field-effect transistors 154, 156 of circuitry 100 of FIG. 2b may also be set, with certain limitations, by various W/L ratios (W=width, L=length) of the active channel. With such an embodiment, a compensation for piezo influences may, under certain circumstances, also be performed across a wide temperature range.

With bipolar transistors and diodes, the so-called piezojunction effect describes an influence of mechanical stresses in the semiconductor material on their characteristics. Since both temperature-dependent input voltages $U_p$ and $U_n$ of circuitry 100 of FIG. 2b are, in practice, almost always generated using bandgap principles, and since in these bandgap principles, the temperature dependence of a forward voltage of a pn-junction is always used, both voltages are also subject to a small dependence on the mechanical stress exerted onto the semiconductor. This dependence may, however, be included into the compensation to the effect as has already been done in the above equation with regard to the piezo compensation for arbitrary temperatures, on the basis of the following assumptions:

$U_p = U_p(T, \sigma)$, as well as $U_n = U_n(T, \sigma)$

In addition, the dopant concentration of n-type resistors should be smaller than about $10^{18}$ cm$^{-3}$, if possible, in a silicon material, and the dopant concentration of p-type resistors should be smaller than about $3 \times 10^{17}$ cm$^{-3}$. With these dopant concentrations of the resistors, the temperature coefficients of the piezoresistors may be kept largely independent of the exact dopant concentration, so that the piezo compensation circuit, as is depicted, e.g., in FIG. 2b, is subject to process fluctuations to a lesser degree.

In addition, it shall be pointed out that in integrated technology, there are also so-called polysilicon resistors in addition to diffused resistors and resistors produced by means of ion implantation in monocrystalline silicon, for which the above numerical values of the piezo constants apply. These polysilicon resistors do indeed have different numerical values than mentioned above, but may also be employed for the purposes of this invention.

The only significant difference to be noted is that with polysilicon resistors, no pronounced directional dependence occurs with regard to the piezoresistive effect, since this directional dependence is averaged out by averaging across the large number of individual grains in the resistor. To achieve averaging of sufficient quality, a sufficiently large number of individual grains should be contained in the resistor; this can be ensured if the surface area of the polysilicon resistor is significantly larger than the average grain size.

Figure 3A:
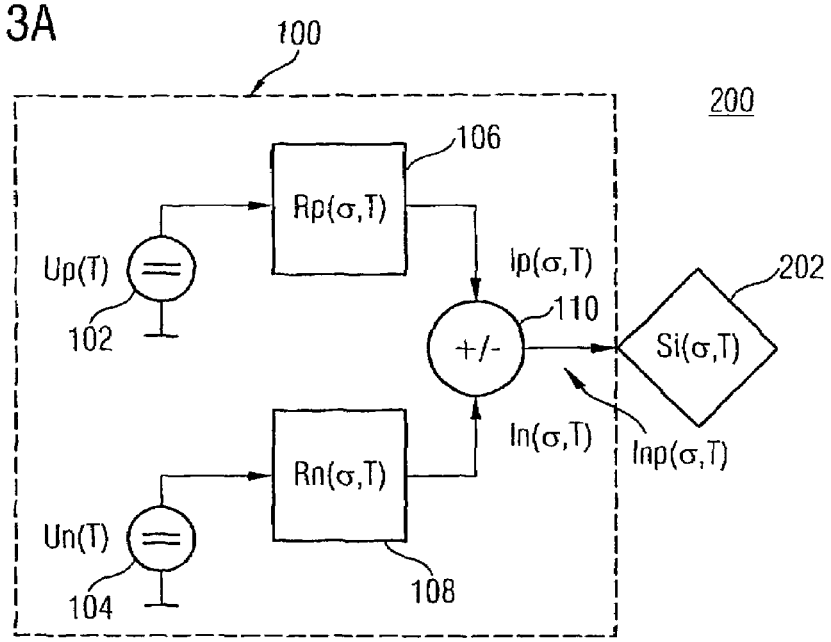
FIGS. 3a-b show a fundamental representation and a representation of a practical embodiment, respectively, of an arrangement for compensating for the piezo Hall effect of a Hall probe with the piezoresistive effect of a reference signal, obtained from n- and p-doped reference resistors, in accordance with a further aspect of the present invention.

By means of circuitry 200, as is depicted in FIG. 3a, a potential implementation of circuitry 100 shown in FIG. 2a will be described below in detail.

As is shown in FIG. 3a, the total current $I_{np}$ obtained by combining partial currents $I_p(T)$ and $I_n(T)$ is used to drive a Hall element 202.

With regard to the following description of circuitry 200 shown in FIG. 3a it should be noted that the circuit elements which have the same functions as or are equivalent to circuitry 100 shown in FIGS. 2a, 2b, are indicated by the same reference numerals and will not be explained in detail again.

Figure 3B:
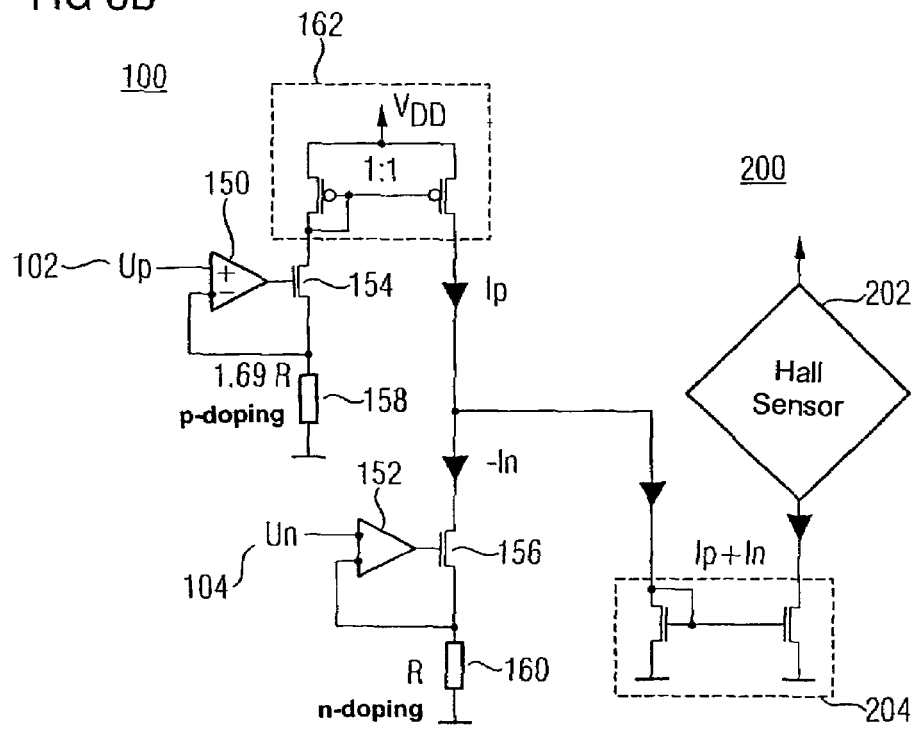

FIG. 3b shows a potential exemplary technical realization of circuitry 200 depicted in FIG. 3a, circuitry 200 depicted in FIG. 3b additionally comprising the Hall probe element 202 in comparison with circuitry 100 shown in FIG. 2b. In addition, the second current mirror circuit 164 shown in FIG. 2b is omitted, FIG. 3b showing a current mirror circuit 204 for coupling the total current $I_{pn}$ into the Hall probe element 202. As is shown in FIG. 3b, the remaining circuit elements are connected.

The basic idea of circuitry 200 shown in FIG. 3a is that the total resistance of the n-type and p-type resistors used may be combined such that the resulting total current $I_{pn}$, employed for driving the Hall probe 202, has a piezoresistive dependence on mechanical stresses in the semiconductor material of the semiconductor circuit chip which is opposite to the magnetic current-related sensitivity $S_i$ of the Hall probe 202, so that the ratio of the two different piezo dependencies remains essentially constant. Thus it is possible to compensate for the piezo Hall influence on the magnetic current-related sensitivity $S_i$ of Hall probe 202 by means of the piezoresistive influence on the resistive elements 106, 108.

To this effect, it is important, initially, that the Hall probe 202 be exposed, essentially within a predefined tolerance range, to the same mechanical stresses as resistive elements 106, 108 and 158, 160, respectively, of FIG. 3b.

This can be achieved, for example, by placing the resistive elements 158, 160 and the Hall probe 202 to be as close together as possible in the circuit layout and, ideally, by interlacing them, e.g. in the order "resistor—Hall probe—resistor", or by symmetrically surrounding the Hall probe 202, for example, by four resistors.

In addition, it is preferred to place the Hall probe 202 and the resistive elements 158, 160 in the center of the semiconductor circuit chip, since the mechanical stress acting upon the circuit elements is as homogeneous as possible there, so that adjacent structures are subject to essentially identical mechanical stresses.

To realize the circuitry 200 depicted in FIGS. 3a-b, undesired directional dependencies of the piezo effects on the circuit elements are taken into account. With regard to the piezo Hall effect on the magnetic, current-related sensitivity $S_i$ of the Hall probe 202 in a {100} silicon material, essentially no directional dependence is to be found.

However, it should be noted that for other crystal planes of the semiconductor material, wherein no directional independence of the piezo Hall effect is present, current flows through the Hall probe 202 in a first direction in a first clock interval, and in a second direction in a second clock interval, and subsequently, the output signal is subject to temporal averaging. To this effect, both current flow directions would have to be selected such that the average of the current-related sensitivity of the Hall probe 202 becomes independent of the crystal direction. In individual cases, this is to be determined in a numerical manner in dependence on the semiconductor materials and/or their crystal planes used.

It should be noted that a further inventive alternative might be to use two Hall probe elements and to offset the averages of their current-related sensitivities in a signal-processing arrangement. Under certain anisotropy conditions, this concept, or principle, may of course be extended to more than two current directions and/or more than two Hall probes.

To render the resistance of the resistive elements 158, 160 independent of the direction of the mechanical stress, reference is made to the above illustrations with regard to arranging two resistive elements so as to be perpendicular to one another and to be electrically connected in series or in parallel (cf. illustrations on FIGS. 2a-b). In addition, it should be noted that the L layout also functions with lateral bipolar transistors.

In a {100} silicon material, the piezo Hall coefficient $P_{12}=\pm 42\%/GPa$ as well as the normal stress components $\sigma_{xx}$, $\sigma_{yy}$ in the plane of the chip surface of the semiconductor circuit chip are relevant to the piezo Hall effect. It is above all the piezoresistive coefficients $\pi_{11}$, $\pi_{12}$ as well as the normal stress components in the plane of the chip surface of the semiconductor circuit chip that are relevant to the piezoresistive effect.

The following applies to n-doped resistors:

$$\pi_n=(\pi_{11}+\pi_{12})/2=-24.4\%/GPa,$$

whereas the following applies to p-doped resistors:

$$\pi_p=(\pi_{11}+\pi_{12})/2=+2.8\%/GPa,$$

By mixing the p- and n-resistors, and/or the resistances, with the respective piezo dependencies in a suitable manner, a resulting total current $I_{np}$ may be generated which exhibits a dependence on mechanical stress of −42%/Gpa, and thus compensates for the piezo Hall coefficient of Hall probe 202:

If $I_p$ is the current from the p-doped resistor and $I_n$ is the current from the n-doped resistor, they can both be mixed:

$$I=I_p+I_n.$$

In addition, the following applies to current $I_p$:

$$I_p=U_p/R_p=U_p/[R_{p0}(1+\pi_p\sigma)]\approx(U_p/R_{p0})(1-\pi_p\sigma)$$

Furthermore, it should also be noted here that the following applies:

$$\sigma=\sigma_{xx}+\sigma_{yy}$$

The same is true for the current from the n-doped resistor. It thus follows that:

$$S_iI=S_{i0}(1+P\times\sigma)[I_{p0}(1-\pi_p\times\sigma)+I_{n0}(1-\pi_n\times\sigma)]$$

wherein $I_{p0}=U_p/R_{p0}$ and $I_{n0}=U_n/R_{n0}$.

In a linear approximation, this results in:

$$S_I = S_{i0}\{I_{po}+I_{no}+[-I_{po}\pi_p - I_{no}\pi_n + P(I_{po}+I_{no})]\sigma\}.$$

Thus, the following condition has to be met for insensitivity toward mechanical stress:

$$I_{po}\pi_p + I_{no}\pi_n = P(I_{po}+I_{no})$$

This results in the following ratio of p-type current from a p-type resistive element to n-type current from an n-type resistive element:

$$\frac{I_{po}}{I_{no}} = -\frac{P-\pi_n}{P-\pi_p}$$

The following results for the above numerical values for {100} silicon:

$$I_{po}/I_{no} = (24.4+42)/(2.8+42) = 1.694.$$

What is special about the piezo dependencies presented above is that both resulting currents $I_p$ and $I_n$ are subtracted (e.g. after suitable weighting). The reason for this is that the value of −42%/Gpa of the piezo Hall dependence, to be compensated for, of Hall probe 202 is outside the range of −24.4%/GPa and +2.8%/GPa spanned by the n- and p-type resistors.

FIG. 3b shows an exemplary, practical realization of circuitry 200, by means of which a formation of a difference may be achieved with regard to the two currents $I_p$ and $I_n$ obtained. Concerting the circuitry depicted in FIG. 3b it is initially assumed that the first input voltage $U_p$ and the second input voltage $U_n$ are identical, i.e. $U_p = U_n$. The first input voltage $U_p$ is copied onto the p-doped resistor 158, having the resistance 1.69 R, by means of the first operational amplifier 150 configured as a unity-grain amplifier, and by means of the first nMOS transistor. The drain terminal 154a of this nMOS field-effect transistor 154 draws a current of a quantity $I_p$ toward ground.

The second input voltage $U_n$ is copied onto the n-doped resistor 160, having the resistance R, by means of the second operational amplifier 152, which is also configured as a unity-grain amplifier, and by means of the nMOS field-effect transistor 156. The drain terminal 156b of this nMOS field-effect transistor 156 draws a current of a quantity $I_n$ toward ground.

The first partial current $I_p$ is mirrored at the positive supply voltage of circuitry 200 by the current mirror circuit 162, and is sent into the drain terminal 154a of the nMOS field-effect transistor 154, which, however, only can draw the partial current $I_n$ toward ground. Thus, the difference of the two partial currents $I_n$, $I_p$ flows into the current mirror circuit 204 consisting of nMOS field-effect transistors, and is fed into Hall probe 202 accordingly.

As is depicted in FIG. 3b, current mirror circuit 162 preferably has a current mirror ratio of 1:1, assuming that the first input voltage $U_p$ and the second input voltage $U_n$ are identical.

It should also be noted that the first and second input voltages $U_p$ and $U_n$ may also be selected to be different, it being possible to subsequently adjust this difference by means of a suitable current mirror ratio of the current mirror circuit 162. In addition, it should be noted that integrated resistors are subjected to process tolerances, so that it is recommendable to make the current mirror circuit 162 adjustable to thus offset process tolerances, preferably in wafer testing. This has already been explained with reference to FIGS. 2a-b.

The procedure described with reference to FIGS. 3a-b for compensating for piezo Hall influences on Hall probe 202 by means of piezoresistive influences on resistive elements 158, 160 functions if the respective piezo coefficients are independent of temperature. However, since the piezo coefficients exhibit a temperature dependence which additionally depends on the doping of the respective semiconductor devices, i.e. on the Hall probe 202 and the integrated resistors 158, 160, a suitable temperature dependence is associated, in accordance with the invention, with the first and second input voltages $U_p$, $U_n$. This is possible with so-called bandgap principles. Eventually, the following general equation applies, in accordance with the invention, to a piezo compensation while taking into account the temperature dependence:

$$\frac{I_{po}(T)}{I_{no}(T)} = -\frac{P(T)-\pi_n(T)}{P(T)-\pi_p(T)}$$

wherein T indicates the temperature.

With $I_{p,0}(T) = U_p(T)/R_{p,0}(T)$ and $I_{n,0}(T) = U_n(T)/R_{n,0}(T)$, the following also results:

$$\frac{U_p(T)}{U_n(T)} = -\frac{R_{p0}(T)}{R_{n0}(T)} \times \frac{P(T)-\pi_n(T)}{P(T)-\pi_p(T)}.$$

The temperature dependence represented on the right-hand side of the above equation is largely predetermined by the semiconductor manufacturing process of the integrated circuitry 200. The temperature dependence represented on the left-hand side of the above equation, however, may be produced with the so-called bandgap circuits, so that it is made possible to compensate for the mechanical stress influences on the Hall probe 20 for various temperatures, or for a predefinable temperature range. Since the two input voltages $U_p$, $U_n$ are available for temperature compensation, and since initially, only one compensation equation needs to be met, several solutions to the above equation are feasible. The system of equations is therefore redundant.

However, since in practice one wants to achieve a certain temperature dependence of the magnetic sensitivity of the overall system, for example to thereby compensate for the thermal response of a permanent magnet, the following, second equation still needs to be met in the event of vanishing mechanical stress:

$$S(T) = S_{i0}(T) \times (I_{p,0}(T)+I_{n,0}(T)) = S_{i0}(T) \times (U_p(T)R_{p0}(T)+U_n(T)/R_{n0}(T))$$

Using both above compensation conditions, this results in $$U_n(T) = R_{n0}(T) \times \frac{S(T)}{S_{i0}(T)} \times \frac{P(T)-\pi_p(T)}{\pi_n(T)-\pi_p(T)},$$

as well as $$U_p(T) = R_{p0}(T) \times \frac{S(T)}{S_{i0}(T)} \times \frac{P(T)-\pi_n(T)}{\pi_n(T)-\pi_p(T)}.$$

The two right-hand sides of the two latter above equations include the specification factor S(T) (which is specified by the customer of the semiconductor manufacturer) as well as further parameters determined by the technology of the devices used. To achieve the desired thermal response of the magnetic sensitivity $S_i$ of Hall probe 202, the temperature dependencies of the two input voltages $U_p$ and $U_n$ are set, in accordance with the present invention, to comply with the above equations.

The concept of circuitry 200 presented with regard to FIGS. 3a-b for compensating for piezo influences in summary consists in that the piezo Hall effect acting on Hall probe 202 may be compensated for by the piezoresistive effect acting on one or several resistive elements. To this end, the dependence of the magnetic sensitivity of Hall probe 202 as well as of the resistance of the n- and p-doped reference resistors used on mechanical stress is made to be essentially non-directional by means of layout measures. This is achieved if the functional parameter of Hall probe 202, and thus the magnetic current-related sensitivity $S_i$, which corresponds to the electronic functional parameter of the second functional element 14 of FIG. 1, exhibits essentially the same directional dependence toward the piezo Hall effect as does the resistance of the integrated resistors 158, 160 toward the piezoresistive effect, the resistive elements depicted in FIGS. 3a-b representing the first functional element 12 of FIG. 1, and the stress-dependent resistance of resistive elements 158, 160 of FIG. 3b corresponding to the electronic functional parameter of the second functional element 14 of FIG. 1.

In accordance with the embodiment of FIGS. 3a-b, a reference current is generated from the p- and n-doped resistors, respectively, both reference currents $I_n$, $I_p$ having a suitable ratio in accordance with the piezoresistive coefficients for n- and p-type doping, respectively. The difference of the two partial currents generated from the two resistors, which difference may be amplified again, is then impressed into the Hall probe 202 as a control current.

To also enable, in accordance with the invention, compensation for mechanical stress influences on the magnetic sensitivity of Hall probe 202 across a wide temperature range, the thermal response of the ratio of the two n- and p-partial currents $I_n$, $I_p$ is set, in accordance with the invention, in a suitable manner by means of the first and second input voltages $U_p$, $U_n$.

It should also be noted that it is also possible, of course, to compensate for the resulting thermal response of the magnetic sensitivity S of Hall probe 202, and/or to set it to a desired value, by selecting the thermal response of the total current $I_{pn}$ accordingly. Thus it may be achieved, for example, that the magnetic sensitivity of Hall probe 202 has a predefined thermal response which, in turn, may compensate for a known thermal response of an object to be measured. This is achieved by setting the thermal response of a common multiplicative factor of input voltages $U_p$, $U_n$ accordingly. Since this common multiplicative factor comes up in the numerator and the denominator of the matching condition for the piezo compensation, it can be eliminated due to reduction and thus does not influence the piezo compensation, but solely effects the thermal response of the magnetic sensitivity S.

So far it has been shown how the magnetic sensitivity S may be made as constant as possible, when the mechanical stress is changed, starting from a stress-free state. In practice, one is more interested, for the most part, in keeping the magnetic sensitivity S constant, with small changes $\delta\sigma$ of the mechanical stress around an operating point $\sigma_0$. For example, the following applies at room temperature in a small IC package in a dry state: $\sigma_{xx}+\sigma_{yy}=-150$ Mpa. However, if the sealing compound of the package takes up moisture, the following is true: $\sigma_{xx}+\sigma_{yy}=-50$ MPa. In this case, one can speak of a constant fundamental term $\sigma_0=-100$ MPa and a superimposed fluctuation $\delta\sigma=\pm50$ MPa. The goal is to achieve a constant magnetic sensitivity by means of the piezo-compensation circuit despite superimposed pressure fluctuations. If the above considerations are pursued, what results for this task is the slightly modified piezo-compensation condition $$\frac{U_p(T)}{U_n(T)} = -\frac{R_p(T,\sigma_0)}{R_n(T,\sigma_0)} \times \frac{P(T)-\pi_n(T)}{P(T)-\pi_p(T)},$$

which eventually leads to $$U_n(T) = R_n(T,\sigma_0) \times \frac{S(T)}{S_i(T,\sigma_0)} \times \frac{P(T)-\pi_p(T)}{\pi_n(T)-\pi_p(T)},$$

$$U_p(T) = -R_p(T,\sigma_0) \times \frac{S(T)}{S_i(T,\sigma_0)} \times \frac{P(T)-\pi_n(T)}{\pi_n(T)-\pi_p(T)}.$$

The general, non-linear theory will be dealt with below. If one wants to eliminate the stress sensitivity of S ($=dS/d\sigma$) in a general form, the following, most general theory applies:

$$S(\sigma) = S_i(\sigma)\left(\frac{U_p(\sigma)}{R_p(\sigma)} - \frac{U_n(\sigma)}{R_n(\sigma)}\right)$$

with $$S_i(\sigma)=S_{i0}(1+P\sigma),\ R_p(\sigma)=R_{p0}(1+\pi_p\sigma),\ R_n(\sigma)=R_{n0}(1+\pi_n\sigma),$$

wherein $S_{i0}$, $R_{p0}$ and $R_{n0}$ depend only on temperature, but no longer on mechanical stress. This may be transformed to $$S(\sigma) = S_{i0}\frac{U_n}{R_{n0}} = f(\sigma) \text{ with}$$

$$f(\sigma) = (1+P\sigma)\left(y(\sigma)\frac{1}{1+\pi_n\sigma} - \frac{1}{1+\pi_p\sigma}\right) \text{ and}$$

$$y(\sigma) = \frac{U_p(\sigma)}{U_n} \frac{R_{n0}}{R_{p0}}.$$

The stress sensitivity is eliminated if the condition $df(\sigma)/d\sigma=0$ is met. This leads to a common differential equation for $y(\sigma)$:

$$\frac{dy}{d\sigma} + \frac{P-\pi_p}{(1+P\sigma)(1+\pi_p\sigma)} y = \frac{(P-\pi_p)(1+\pi_p\sigma)}{(1+P\sigma)(1+\pi_n\sigma)^2}$$

with the solution $$y = \frac{1+\pi_p\sigma}{1+P\sigma}\left(C_1 + \frac{\pi_n - P}{\pi_n}\frac{1}{1+\pi_n\sigma}\right)$$

wherein $C_1$ is the free constant of a $1^{st}$-order differential equation for meeting a boundary condition. $C_1$ does not depend on stress, but may indeed depend on temperature. It is to be noted that the solution y, in turn, describes the ratio of $U_p$ to $U_n$, this ratio being stress-dependent, in the most general case, unlike the simple solutions given above (see the a terms on the right-hand side of the equation).

Inserting the solution back into the formula for S results in $$S(\sigma) = S_{i0} \frac{U_n}{R_{n0}} \frac{C_1 \pi_n - P}{\pi_n}$$

Please note that in this case, the magnetic sensitivity S is completely independent of stress (i.e. this is not just an approximation!). However, this is achieved only if $U_p$ is made dependent on stress in a relatively complicated manner ($U_n$ is, as is known, independent of stress by definition):

$$U_p(\sigma) = U_n \frac{R_{p0}}{R_{n0}} \frac{1 + \pi_p \sigma}{1 + P\sigma} \left( C_1 + \frac{\pi_n - P}{\pi} \frac{1}{1 + \pi_n \sigma} \right)$$

For example, one may select $C_1 = 1 + P/\pi_n$, so that follows:

$$U_p(\sigma) = U_n \frac{R_{p0}}{R_{n0}} \left( \frac{1 + \pi_p \sigma}{1 + P\sigma} + \frac{1 + \pi_p \sigma}{1 + \pi_n \sigma} \right)$$

and eventually $$S(\sigma) = S_{i0}(\sigma) U_n / R_{n0}.$$

Assuming, still more generally, that both $U_p$ and $U_n$ are dependent on stress, it is likely that solutions will be found wherein the stress dependencies of $U_p$ and $U_n$ are of a simpler form than outlined so far. However, to this end, a common $2^{nd}$-order differential equation system with σ-dependent coefficients for $U_n(\sigma)$ and $U_p(\sigma)$ is to be solved, which is difficult.

Figure 4:
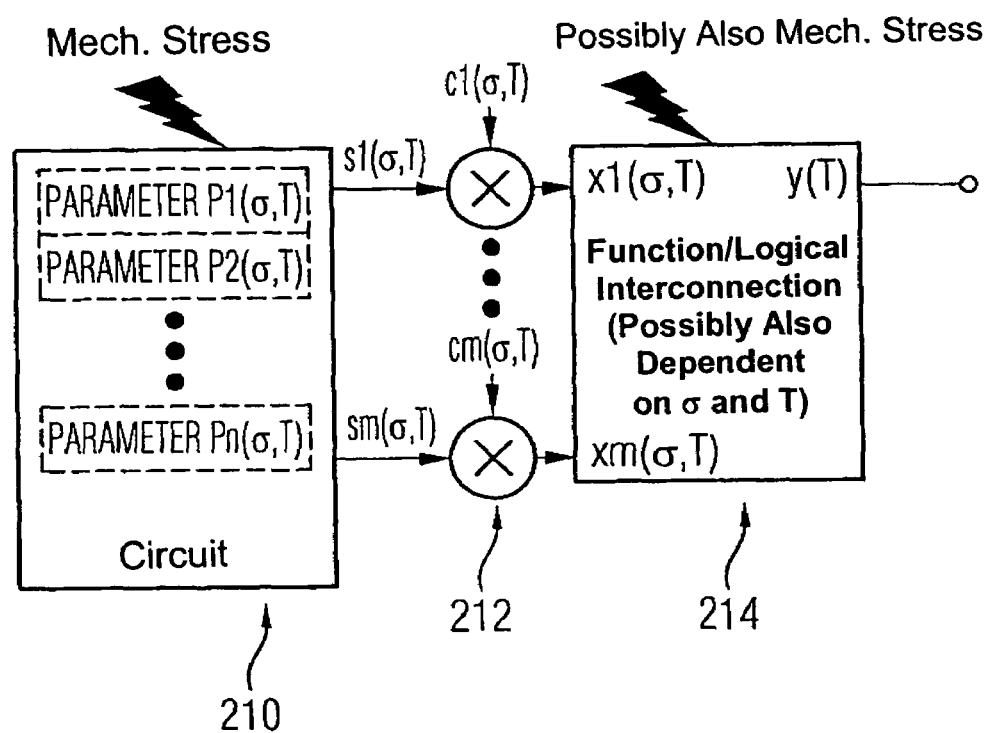
FIG. 4 is a fundamental representation of an arrangement for interconnection a plurality of piezo-dependent functional parameters to obtain a piezo compensation in accordance with the present invention.

The generalized basic principle of the circuitry depicted in FIGS. 3a-b for compensating for piezo influences will be described below with reference to FIG. 4. Circuitry 200 includes a circuit part 210, a weighting portion 212 and a combination portion 214.

The n parameters of the circuit part 210 are influenced by the temperature and mechanical stresses in the semiconductor material of the semiconductor circuit chip.

Circuit part 210 provides m starting variables $s_1 \ldots s_m$, which are influenced, among others, by parameters $P_1 \ldots P_n$ and are thus influenced, as a further consequence, by mechanical stresses as well as by the ambient temperature. The variables $s_1 \ldots s_m$ are weighted by weighting coefficients $c_1 \ldots c_m$ in the weighting portion 212, these weighting coefficients being influenced, e.g., by the temperature, in particular. They may additionally also be influenced by the mechanical stress, which is not required, however, for the function of the inventive piezo-compensation principle. However, it may be predefined, for practical reasons, that the weighting coefficients be influenced by the mechanical stress, for example.

In accordance with the above indications, m variables $x_1 \ldots x_m$ result in accordance with the algorithm $$x_i = s_i * c_i.$$

The m variables $x_1 \ldots x_m$ are input quantities of a function which obtains at least one output quantity y therefrom, it being the nature of the inventive piezo compensation that the output quantity y is, to a very large extent, no longer influenced by the mechanical stress at least in an "operating point" $\sigma_0$, i.e. that the following relationship applies:

$$dy(\sigma_0, T)/d\sigma = 0$$

The output quantity function y $$y(\sigma, T) = F(x_1(\sigma, T), \ldots x_m(\sigma, T), \sigma, T)$$

is to be seen as a functional interconnection in the most general sense, i.e. it is to be seen that it may be multi-valued or stochastic. In a further case, the output quantity function y(σ,T) may very well be influenced by small changes in the mechanical stress at a certain point in time, but is no longer influenced on a temporal average or a temporal square average or on a temporal cubic average.

Thus, the following mathematical formulation applies to the output quantity function:

$$y(T) = F\{c_1(\sigma,T) * s_1[P_1(\sigma,T), \ldots P_n(\sigma,T)], \ldots, c_m(\sigma, T) * s_m[P_1(\sigma,T), \ldots P_n(\sigma,T)], \sigma, T\}$$

The mechanical stress present in the semiconductor material can act in various directions. As soon as one of the parameters $P_1 \ldots P_n$ is not influenced by the direction of the mechanical stress, all other relevant parameters should also be independent, to a large degree, of the direction of the mechanical stresses in the semiconductor material.

The functional interconnection may be, in particular, a linear combination of input quantities $x_1 \ldots x_m$, but it may also be a non-linear function. The realization may be purely analog, purely digital or a mixture of analog and digital.

An example of a purely analog realization with a non-linear function is circuitry 200 of FIG. 3b. Circuitry 200 of FIG. 3b essentially has n=3 parameters which depend on the mechanical stress and the temperature present in the semiconductor material, i.e. the resistance $R_p(\sigma, T)$ of the p-doped resistor, and the resistance $R_n(\sigma, T)$ of the n-doped resistor, as well as the current-related sensitivity $S_i(\sigma, T)$ of Hall probe 202:

$$P_1(\sigma, T) = R_p(\sigma, T), \text{ as well as}$$

$$P_2(\sigma, T) = R_n(\sigma, T) \text{ and}$$

$$P_3(\sigma, T) = S_i(\sigma, T)$$

Variables $s_1$, $s_2$ and $s_3$ are $$s_1(\sigma, T) = 1/R_p(\sigma, T), \text{ as well as}$$

$$s_2(\sigma, T) = 1/R_n(\sigma, T) \text{ and}$$

$$s_3(\sigma, T) = S_i(\sigma, T))$$

The partial currents $I_p$, $I_n$ are equivalent to the variables $x_1$ and $x_2$, so that the following relationship results:

$$x_i(\sigma, T) = I_p(\sigma, T), \text{ as well as}$$

$$x_2(\sigma, T) = I_n(\sigma, T)$$

The weighting coefficients are formed as follows by the temperature-dependent input voltages $U_p$ and $U_n$:

$$c_1(\sigma, T) = U_p(\sigma, T) \text{ and}$$

$$c_2(\sigma, T) = U_n(\sigma, T)$$

wherein the two input voltages $U_p$ and $U_n$ ideally do not depend on the mechanical stress σ present in the semiconductor material of the semiconductor circuit chip.

As practical embodiments, the input voltages $U_p$ and $U_n$ may be formed by band-gap principles exhibiting only a relatively small dependence on mechanical stress. In the embodiment of circuitry 200 which is depicted with reference to FIG. 3b, the weighting factor $c_3(\sigma, T)$ has a value of 1.

The non-linear functional interconnection between the starting variables y is as follows:

$$y = x_3 * (x_1 - x_2), \text{ also}$$

$$y = c_3 * s_3 * (c_1 * s_1 - c_2 * s_2)$$
$$= 1 * S_i(\sigma, T) * (U_p(T)/R_p(\sigma, T) - U_n(T)/R_n(\sigma, T)),$$

the interconnection y being the total magnetic sensitivity of the system 200 of FIG. 3b. With a suitable ratio of the p- and n-doped resistors, the total magnetic sensitivity of the system 200 is largely independent of the mechanical stress present in the semiconductor material of the integrated circuitry. The suitable ratio results from zeroing the differentiated interconnection y with $$dy(\sigma_0)/d\sigma = 0$$

In accordance with the present invention it is to be noted that preferably all temperature dependencies as well as the mean mechanical stress $\sigma_0$ present on the integrated semiconductor chip should be known so as to be able to set the inventive piezo compensation in a suitable manner. In addition, it should be noted with regard to the present invention that the thermal responses of the two input voltages $U_p(T)$ and $U_n(T)$ are preferably set such that the compensation condition "$dy(\sigma_0)/d\sigma=0$" is met in the entire specified temperature range. The following equations show that it is possible to meet this requirement:

$$S_i(\sigma, T) = S_i(0, T)*(1+\sigma^*P(T))$$

$$R_p(\sigma, T) = R_p(0, T)*(1+\sigma^*\pi_p(T))$$

$$R_n(\sigma, T) = R_n(0, T)*(1+\sigma^*\pi_n(,T))$$

What results is $$y(\sigma, T) = S_i(0, T)(1+\sigma^*P(T)^*(U_p(T)/R_p(0, T)/(1+\sigma^*\pi_p(T))-U_n(T)/R_n(0, T)/(1+\sigma^*\pi_n(T)))$$

The condition $$dy(\sigma_0)/d\sigma = 0$$

reads as follows in detail:

$$P(T)^*(U_p(T)/R_p(\sigma_0, T) - U_n(T)/R_n(\sigma_0, T)) = (1+\sigma_0^*P(T)^* (\pi_p(T)^*U_p(T)/R_p(\sigma_0, T)/(1+\sigma_0^*\pi_p(T)) - \pi_n(T)^*U_n(T)/R_n(\sigma_0, T)/(1+\sigma_0^*\pi_n(T)))$$

It becomes obvious from the above equations that the temperature dependencies of the piezo constants $P(T)$, $\pi_p(T)$, $\pi_n(T)$ may counteract the temperature dependencies (which may be set, e.g., by means of the circuit design which will be explained below) of the input voltages $U_p(T)$, $U_n(T)$, and thus the compensation condition $dy(\sigma_0)/d\sigma=0$ may be met, in accordance with the invention, in a sufficient approximation in a wide temperature range.

To take into account any process tolerances that may occur with regard to resistors $R_p(0,T)$ and $R_n(0,T)$, the integrated resistors should be matched in a condition which is as stress-free as possible, it being possible for this to occur, preferably, during wafer testing. Since the integrated circuitry is not yet assembled in the package, the global mechanical stress is minimal. There is only a minor global mechanical stress stemming from semiconductor production, since here, too, various layers are deposited onto the integrated semiconductor chip at various temperatures.

Additional potential practical realizations, or embodiments, of the circuitry represented in FIG. 1 for compensating for piezo influences will be explained below with reference to FIGS. 5a-b, particular emphasis being placed, in particular, on compensating for piezo influences on constant voltage sources.

Figure 5A:
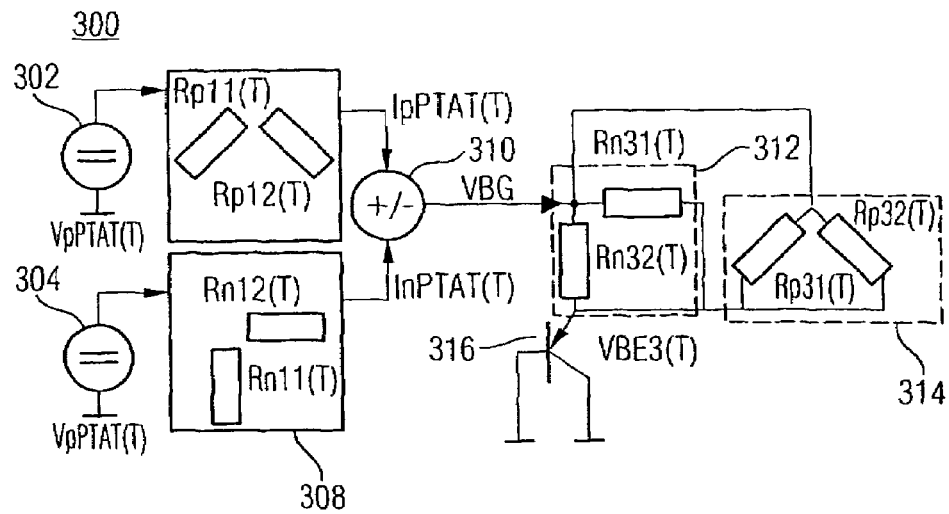
FIGS. 5a-b are exemplary representations of bandgap circuits for compensating the piezojunction effect by means of a piezoresistive effect in accordance with a further aspect of the present invention.
Figure 5B:
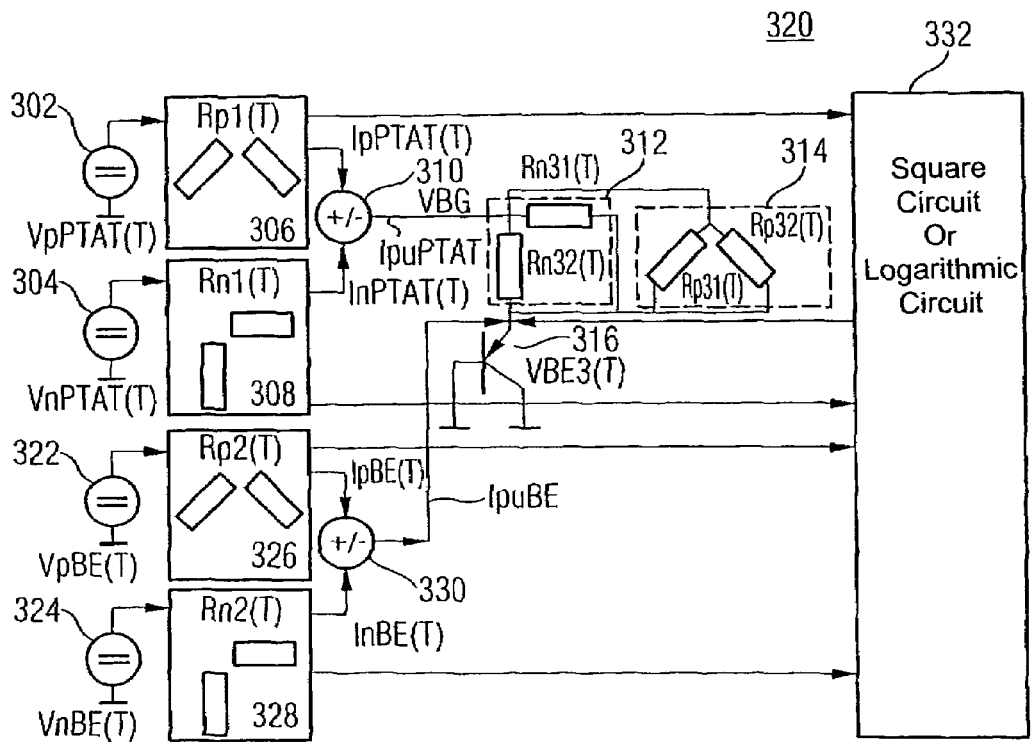

The basic idea of the piezo compensation depicted with reference to FIGS. 5a-b is that by mixing the resistances of p- and n-doped resistors and/or the partial currents $I_n$, $I_p$ produced from same, in a suitable manner, a total current (or, by a combination of partial voltages, a total voltage) may be generated which exhibits a dependence on the mechanical stress present in the semiconductor material of the integrated circuit chip, so as to compensate for the very piezojunction effect due to the mechanical stress in the semiconductor material in the saturation current or in the emitter-base voltage of a bipolar transistor.

The effect which has already been described is used again here, which consists in that with a first resistive element $R_{n1}$ of the first conductivity type, the piezoresistive effect which is due to a mechanical stress in the semiconductor material impacts the resistance differently than with a resistive element $R_{p1}$ of the second conductivity type.

If, in a so-called band-gap circuit, the base-emitter voltage $V_{BE}$ of a bipolar transistor changes, i.e. decreases, with a constant current as a result of the stress-dependence, this piezojunction effect of the bipolar transistor is compensated for, in accordance with the invention, with the piezoresistive effect of the two resistive elements mentioned above which have different conductivity types, by summing the currents or voltages obtained by the two resistive elements, or by forming a difference with regard to same, and by feeding the resulting total current, or the resulting total voltage, into the bipolar resistor of a band-gap circuit. It should be noted, within the framework of the present invention, that for non-linear stress dependencies, the formation of a sum or difference of the partial currents, or partial voltages, may also be performed from squared current portions or voltage portions, or current or voltage portions of which the logarithm has been taken, of the first and second resistive elements $R_{n1}$ and $R_{p1}$.

In accordance with the present invention, it is now possible to achieve the compensation for the piezojunction effect of a bipolar transistor (or of a diode), since the stress dependence of the piezojunction effect of the vertical bipolar transistor (or of a diode) in a {100} semiconductor material (preferably in a {100} silicon material) is essentially isotropic. In this regard, the Hall probe and the vertical bipolar transistor exhibit a similar behavior in {100} silicon, which is why similar piezo compensation circuits may also be used.

The isotropy of the stress sensitivity of the first and second resistive elements $R_{n1}$ and $R_{p1}$ may be achieved by a 90° arrangement of partial resistors disposed in a parallel or series circuit. As has already been mentioned in detail above, the n-doped $R_{n1}$ 90° arrangement is laid perpendicular and parallel to the primary flat of a {100} semiconductor wafer, and the $R_{p1}$ 90° arrangement is laid out at an angle of +/−45° in relation to the primary flat of the semiconductor wafer, since in this case the stress coefficients of the resistors (resistive elements) are smallest, and since therefore, mismatches of the 90° resistor arrangement have only a minimal effect on the stress sensitivity.

In the embodiments shown with reference to FIGS. 5a-b it is important that the respective bipolar transistors and resistors are exposed to the same mechanical stress in the semiconductor material of the integrated semiconductor circuit chip. The appropriate layout measures have already been described in detail above.

In a {100} silicon material, for the piezojunction effect, the piezojunction coefficient which is linear in $\sigma_{xx}+\sigma_{yy}$ is −43.4%/GPa for vertical npn-type transistors (V-NPN), and −13.8%/GPa for vertical pnp-type transistors (V-PNP), the normal stress components $\sigma_{xx}$, $\sigma_{yy}$ being relevant, in addition, in the plane of the chip surface. Furthermore, the relevant coefficients of the piezojunction tensor for the square portions of the direct stress components are known to be ±37.5%/GPa$^2$ (for V-NPN) and +66%/GPa$^2$ (for V-PNP).

From the above indications it is now possible to calculate, via the logarithmic characteristic, the change in the base-emitter voltage $\Delta V_{BE}$ with mechanical stress acting in the semiconductor material, the following numerical values resulting, for example: $\Delta U_{BE}$=−1.5 mV with a vertical pnp-transistor with a stress component of −180 MPa. It should be noted that the stress effect is non-directional (isotropic) in the first approximation.

What is relevant to the piezoresistive effect of a 90° resistor arrangement are mainly the piezoresistive coefficients $\pi_{11}$, $\pi_{12}$, as well as the main-axis stresses $\sigma_{xx}$, $\sigma_{yy}$ in the plane of the chip surface. Thus, the following relationship applies again to n-doped resistors for the piezoresistive coefficient $\pi_n$, and to p-doped resistors for the piezoresistive coefficient $\pi_p$ at room temperature:

$\pi_n=(\pi_{11}+\pi_{12})/2=-24.4\%/GPa$, $\pi_p=(\pi_{11}+\pi_{12})/2=+2.8\%/GPa$.

By mixing the resistances of the p- and n-doped resistors in a suitable manner, a total current or a total voltage may now be generated, the dependence of which on the mechanical stress present in the semiconductor material corresponds to the very piezojunction dependence of the saturation current or of the base-emitter voltage of a bipolar transistor (in terms of quantity).

Since the optimum mixing ratio for obtaining as little stress sensitivity as possible may change as the ambient temperature (semiconductor temperature) changes, a temperature-dependent generation of the two partial currents or partial voltages from the differently-doped resistors is useful. Here, the so-called band-gap principle may be employed, for example, a voltage change portion $\Delta V_{PTAT}$ (PTAT=proportional to the absolute temperature change), which depends on the absolute temperature, providing a more positive temperature coefficient compared to the base-emitter voltage change portion $\Delta V_{BE}$ (+5000 . . . +6000 ppm/K).

The current coming from the p-doped resistor of a first band-gap-PTAT voltage source $V_{pPTAT}$ is referred to as current $I_{pPTAT1}$, and the current coming from the n-doped resistor of a second band-gap-PTAT voltage source $V_{nPTAT}$ is referred to as current $I_{nPTAT2}$, both partial currents being mixable by forming a sum or difference, wherein the following applies:

$I_{pnPTAT}=I_{pPTAT}+I_{nPTAT}$

The following is true for $I_{pPTAT1}=V_{pPTAT}/R_p=V_{pPTAT}/[R_{p0}(1+\pi_p\sigma)]=(V_{pPTAT}/R_{p0})(1-\pi_p\sigma)$ The same applies to the current coming from the n-doped resistor.

Thus, what follows for the undulatory current is:

$I_{pnPTAT}=I_{p0}(1-\pi_p\times\sigma)\pm I_{n0}(1-\pi_n\times\sigma)$, wherein $I_{p0}=V_{pPTAT}/R_{p0}$ and $I_{n0}=V_{nPTAT}/R_{n0}$ are stress-free currents or currents related to a reference stress.

For a largely stress-free band-gap voltage VBG $VBG=VBE3+VR$ the stress-dependent base-emitter voltage VBE3 may be stress-compensated for by the stress-dependent current $I_{pnPTAT}$, since the PTAT voltages $V_{nPTAT}$, $V_{pPTAT}$ and the mirrored PTAT voltage VR are, by themselves, largely stress-free across the resistors Rn31, Rn32, Rp31, Rp32, as was described above.

The following applies to the stress dependence of the $V_{BE}$ voltage in an approximative manner, across the log. characteristic of the bipolar transistor, VBE being split up into $VBE_0+\Delta VBE$ in a manner analogous to what was said above:

$$\Delta VBE(T) = \frac{k \cdot T}{q}\ln\left(1+\frac{\Delta I_S}{I_{S0}}\right) \approx \frac{k \cdot T}{q}\left(\frac{\Delta I_S}{I_{S0}}\right),$$

with $VBE(T)=VBE_0(T)+\Delta VBE(T)$

Thus, the following condition is to be met for insensitivity toward mechanical stress:

$$\delta I_{npPTAT} \cong -\delta I_{CT3}$$

with $$\delta I_{npPTAT} = \frac{\Delta I_{npPTAT}}{I_{npPTAT}} = \frac{I_{npPTAT}(\sigma)-I_{npPTAT}(\sigma_0)}{I_{npPTAT}(\sigma_0)}$$

$$\delta I_{CT3} = \frac{\Delta I_{CT3}}{I_{CT3}} = \frac{I_{CT3}(\sigma)-I_{CT3}(\sigma_0)}{I_{CT3}(\sigma_0)}$$

$\sigma_0$=reference stress or stress-free state,
IC=collector current of transistor T3.

Since $I_{CT3}$ is proportional to $I_S$, and since $I_{CT3}$ is identical to $I_{npPTAT}$, the following results for the layout of the circuit:

$$\delta I_{npPTAT} \cong -\delta I_S$$

This results in an optimum ratio of p-current to n-current $$\frac{I_{pPTAT}}{I_{nPTAT}}$$

and an optimum ratio of resistors Rn31, Rn32, Rp31 and Rp32 to one another.

With regard to the present invention, it should be noted, in particular, that it is possible, in accordance with the invention, to combine both partial currents $I_{pPTAT}$ and $I_{nPTAT}$ by means of a "simple" linear combination, e.g. by means of forming a sum or difference.

With reference to FIG. 5a, a circuitry 300 will be represented below in principle, by means of which the piezojunction effect on the base-emitter voltage of a bipolar transistor may be compensated for by means of the piezoresistive effect on the resistance of various reference resistor arrangements.

As is shown in FIG. 5a, circuitry 300 includes a first input voltage source 302 for providing a first input voltage $V_{pPTAT}$(T), a second input voltage source 304 for providing a second input voltage $V_{nPTAT}$(T), a first L resistor arrangement of p-type resistors 306, and a second L resistor arrangement of n-type resistors 308. Circuitry 300 further includes a combination means 310 for combining a first partial signal $I_{pPTAT}$(T), e.g. a first partial voltage or a first partial current, and a second partial signal, e.g. a second partial voltage or a second partial current, $I_{nPTAT}(T)$, further a third L resistor arrangement of n-type resistors 312, a fourth L resistor arrangement of p-type resistors 314, and a pnp-type bipolar transistor 316. The circuit elements 302-316 represented above are connected as is shown, in principle, in FIG. 5a.

The mode of operation of circuitry 300 shown in FIG. 5a will be described below.

The first partial current $I_{pPTAT}$ is generated from the first input voltage source 302, having an input voltage value $V_{pPTAT}(T)$, in connection with the first L resistor arrangement of the p-type resistors 306, and the second partial current $I_{nPTAT}(T)$ is produced from the second input voltage source 304 in connection with the second L resistor arrangement of the n-type resistors 308. The two partial currents are combined in the combination means 310, i.e. subject to an addition or subtraction, whereupon the resulting total current $I_{pnPTAT}$ is fed into the bipolar transistor 316.

As is depicted in FIG. 5a, the first L resistor arrangement 306 contains, in the case of a {100} semiconductor material, e.g. of a {100} silicon material, two or more p-diffused or p-implanted resistors which are arranged perpendicularly to one another and one above the other and which are placed at an angle of ±45° to the primary flat of the semiconductor wafer. The second L resistor arrangement 308 preferably contains, in the case of a {100} semiconductor material, two or more n-diffused or n-implanted resistors arranged perpendicularly to one another at an angle of 0°/90° to the primary flat. In the case of a {100} semiconductor material, the bipolar transistor 316 is preferably configured as a vertical substrate pnp-type bipolar transistor, since the latter may readily be realized, in standard CMOS technologies, without additional expenditure. In addition, vertical substrate pnp-type bipolar transistors are, as is known, less stress-sensitive toward npn-type transistors and toward lateral transistors.

In addition, it should be noted that the integrated resistors are subject to process tolerances during manufacturing, so that it is recommended to make the current portions, or resistances, adjustable so as to thereby compensate for process tolerances.

In the above-described procedure for compensating for the piezojunction effect in the bipolar transistor 316 by the piezoresistive effects on the resistances of the resistor arrangements 306, 308, it is to be noted that in the piezojunction effect and the piezoresistive effect, the various piezo coefficients have temperature dependencies, these temperature dependencies additionally depending on the doping of the respective devices.

This temperature dependence of the piezo-coefficients may be compensated for, in accordance with the invention, in that not only $V_{PTAT}$-voltages having a positive temperature coefficient (TC) are used as first and second input voltage sources for current production, but base-emitter voltages $V_{BE}$ with negative temperature coefficients are also used in a controlled manner for current generation, so as to produce partial currents both with positive and negative temperature coefficients.

FIG. 5b shows a respective circuitry 320. In addition to the circuitry 300 of FIG. 5a, circuitry 320 of FIG. 5b further includes a third input voltage source 322 for providing a third input voltage $V_{pBE}(T)$, a fourth input voltage source 324 for providing a fourth input voltage $V_{nBE}(T)$, a fifth L resistor arrangement of p-type resistors 326, a sixth L resistor arrangement of n-type resistors 328, a second combination means 330 for combining a third partial signal $I_{pBE}(T)$ and a fourth partial signal $I_{nBE}(T)$ for obtaining a second total signal $I_{pnBE}$, and a squaring and log circuit 332. The circuit elements represented above are connected as shown in principle in FIG. 5b.

The condition for a stress independence of the transistor saturation current $I_S$ of the bipolar transistor 316 results in the following expression in the first approximation:

$$\delta I_{npPTAT} \pm \delta I_{npBE} \cong -\delta I_S$$

It should be noted with regard to the present invention that it is also possible, in order to match non-linear stress effects in the vertical bipolar transistor 316, to also effect additional current feeds from a non-linear circuit, e.g. the squaring or log circuit 332, into the bipolar transistor 316. According to the representation of FIG. 5b, the input voltages and input currents of this non-linear circuit 332 are eventually also obtained and derived from the L resistor arrangements 306, 308, 326, 328 of circuitry 320 of FIG. 5b.

As an alternative to the input voltages $V_{pPTAT}(T)$, $V_{nPTAT}(T)$ ($V_{PTAT}$ voltages) and $V_{pBE}(T)$ and $V_{nBE}(T)$ ($V_{BE}$ voltages), other input voltages with different temperature coefficients may also be used, e.g. a constant voltage $V_{CONST}$ of a band-gap circuit. The condition for a stress independence in the first approximation is then:

$$\delta I_S(\sigma) \cong -(\delta I_{npPTAT} \pm \delta I_{npCONST})$$

The general concept underlying FIGS. 5a-b for compensating for piezo influences in band-gap circuits will be briefly presented again below.

A first voltage is applied to, and a first current is decoupled from, a first resistive p-type element, a second voltage is applied to, and a second current is decoupled from, a further resistive n-type element. Both partial currents are combined, e.g. subtracted (if need be, i.e. if parameters which correspond to one another are formed in other planes than the (100) silicon plane, they are added) and the result current is fed into a bipolar transistor or used for generating a correction voltage.

The formation of sums or differences may also be performed with voltages generated across two different resistor types.

Also, non-linear stress dependencies may also be compensated for from these voltages or currents with the aid of non-linear circuits. Input quantities for the non-linear circuit here are again voltages or currents that were generated from the two different resistor types.

The concept, depicted in FIGS. 5a-b, for compensating for piezo influences by means of circuitries 300 and 320 may further be expanded to compensating for piezo influences in temperature sensors, as will be explained below with reference to FIGS. 6a-b.

Here, too, a suitable total current or total voltage is generated by a suitable mixture of p- and n-doped resistors, the dependence of this total current and/or voltage on a mechanical stress present in the semiconductor material compensating for the very piezojunction coefficient in the saturation current or in the base-emitter voltage of a bipolar transistor, and thus rendering the reference signal, i.e. the reference voltage or the reference current, of a temperature sensor insensitive to stress.

Figure 6A:
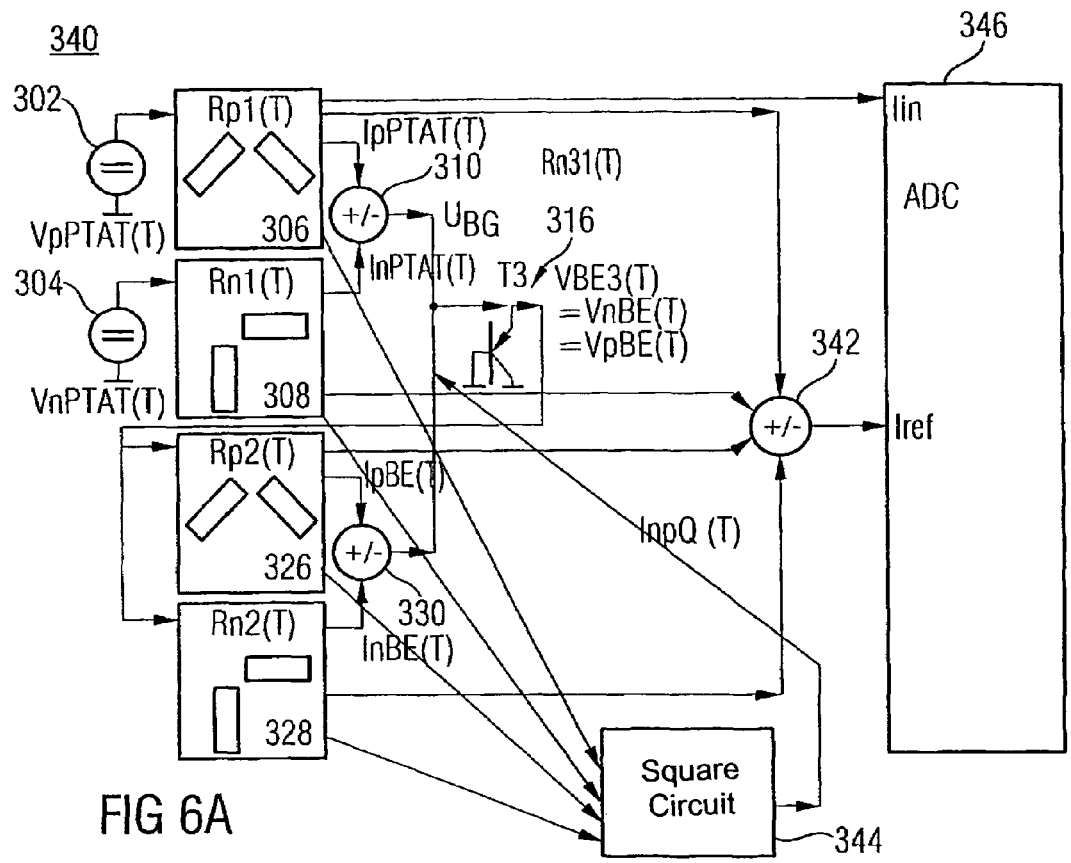
FIGS. 6a-b show fundamental representations of stress-insensitive temperature sensor based on a compensation for the piezojunction effect by a piezoresistive effect in accordance with a further aspect of the present invention.

The circuitry 340, depicted in FIG. 6a, for compensating for piezo influences also includes, unlike circuitry 320 shown in FIG. 5b, a third combination means 342, a squaring circuit 344 and an analog/digital converter 346.

The mode of operation of the circuitry 340, which is depicted in FIG. 6a and which works with an analog/digital converter 346, will be explained below.

The analog/digital converter 346 maps the ratio of two input signals $I_{in}$ and $I_{ref}$ to an output signal, e.g. in the form of an output code. The input signal $I_{in}$ stems from a largely stress-independent voltage source 302, 306 having the voltage $V_{pPTAT}(T)$ which exhibits a characteristic linear to the absolute temperature. The reference signal $I_{ref}$ is formed of currents which eventually lead back to a temperature-independent band-gap voltage $V_{BG}$ formed by summation of the input voltage $V_{pPTAT}$ with positive temperature coefficients and of the input voltage $V_{pBE}$ with a negative temperature coefficient. The following applies:

$$V_{BG} = k_1 V_{PTAT} + V_{BE},$$

with $k_1$ as the weighting factor.

With a constant current, the base-emitter voltage $V_{BE}$ of the bipolar transistor 316 is stress-dependent due to the piezojunction effect. By a weighted current feed of partial currents stemming from p-doped resistors and n-doped resistors, this stress dependence may be compensated for. Since the optimum weighting ratio may change within the temperature range, the n-partial currents and the p-partial currents are derived both from the $V_{PTAT}$ voltage and the $V_{BE}$ voltage. In the analog/digital converter (ADC), only stress-independent ratios may be determined from the currents or voltages weighted in an optimum manner.

With regard to the resistor elements used, it should generally be noted with regard to the present invention that polysilicon, metal, SiCr, NiCr resistors etc. may be used instead of the n-type resistors and/or p-type resistors. It is only to be noted that two different isotropic piezoresistive partial voltages or partial currents may be generated from the various resistor elements.

Figure 6B:
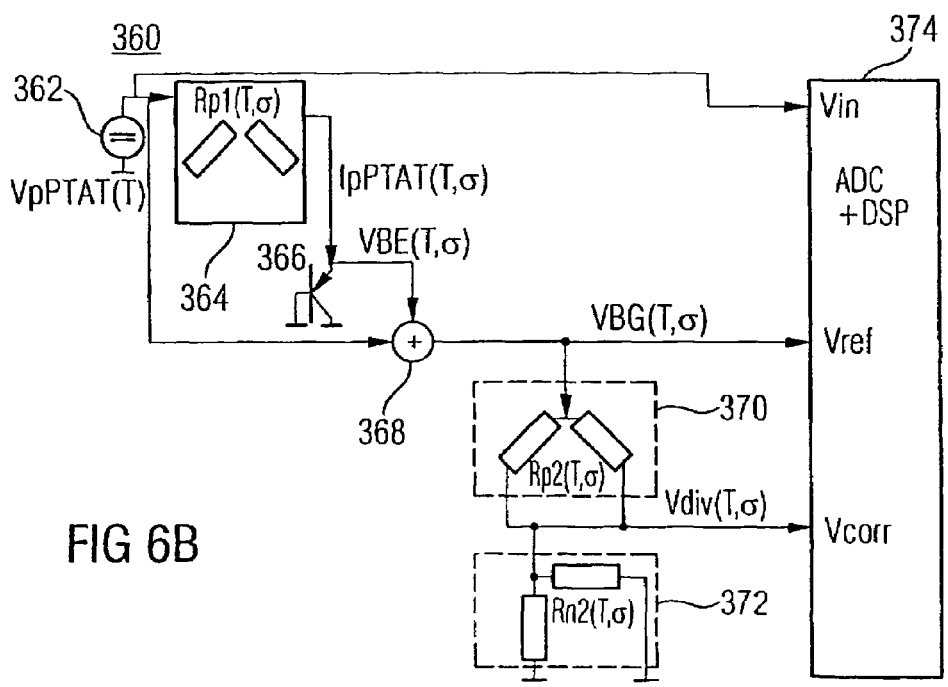

FIG. 6b shows a further circuitry 360 for compensating for piezo influences.

Circuitry 360 includes a first input voltage source 362, a first L resistor arrangement of p-type resistors 364, a pnp-type bipolar transistor 366, a first combination means 368, a second L resistor arrangement of p-doped resistor elements 370, a second L resistor arrangement of n-type resistor elements 372, and a processing means 374 having an analog/digital converter and a digital signal processor.

In the circuitry 360 depicted in FIG. 6b, only such voltages are applied to the analog/digital converter which are stress-dependent to varying degrees. The stress dependence is calculated in the digital signal processor contained in the processing means 374. The differentiation from the desired thermal response $V_{in}/V_{ref}$ is possible, since the input voltages have highly different isotropic stress dependencies. Thus, the input signal $V_{pPTAT}$ of the input voltage source 362 is largely stress-independent, the base-emitter voltage $V_{BE}$ is partially stress-dependent, to be precise because of the piezojunction effect of the bipolar transistor 366 and the piezoresistive effect of the L resistor arrangement 364 of p-doped resistor elements. The voltage $V_{div}$ is highly stress-dependent, due to various isotropic stress dependencies of the second and third L resistor arrangements with p-type and n-type resistors 370, 372.

The temperature dependencies of the various elements, however, differ from the stress dependencies as follows. The voltage $V_{pPTAT}$ of the input voltage source 362 is linear to the absolute temperature, the band-gap voltage $V_{BG}$ exhibits a very small temperature dependence, the voltage $V_{div}$ exhibits a small to medium temperature dependence. Thus, an equation system with six unknown quantities and three equations, respectively, may be established for the stress dependence and the temperature dependence which may be solved by the digital signal processor.

In addition, it should also be noted in accordance with the present invention that the combination and/or mixing function m(F,G) may also be realized in the form of an analog or digital calculating or processing circuit. Any algorithms desired and any linear and non-linear characteristics desired may be used.

For example, the first output signal of the first functional element, which depends on the first functional-element parameter F, may be, e.g., the output signal of a stress sensor, the second output signal of the second functional element, which depends on the second functional-element parameter G, may be, e.g., an output signal of a Hall probe, both signals being converted into numerical codes and offset by an analog/digital converter (ADC) (e.g. by a "look-up" table).

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A circuitry on a semiconductor circuit chip, comprising:
a first functional element comprising a first electronic functional-element parameter exhibiting a dependence in relation to the mechanical stress in the semiconductor circuit chip in accordance with a first functional-element stress influence function, the first functional element being configured to provide a first output signal in dependence on the first electronic functional-element parameter and the mechanical stress,
a second functional element having a second electronic functional-element parameter exhibiting a dependence in relation to the mechanical stress in the semiconductor circuit chip in accordance with a second functional-element stress influence function, the second functional element being configured to provide a second output signal in dependence on the second electronic functional-element parameter and the mechanical stress, and
a combination means for combining the first and second output signals to obtain a resulting output signal with a predefinable dependence on the mechanical stress in the semiconductor circuit chip, wherein
the first and second functional elements being integrated on the semiconductor circuit chip and arranged, geometrically, such that the first and second functional element stress influence functions are identical within a tolerance range.

2. The circuitry as claimed in claim 1, wherein the first electronic functional-element parameter comprises a first piezo influence factor, and the second electronic functional-element parameter comprises a second piezo influence factor, and the first piezo influence factor and the second piezo influence factor being different from one another.

3. The circuitry as claimed in claim 1, wherein the resulting output signal is stress-independent within a tolerance range.

4. The circuitry as claimed in claim 1, wherein the combination means is configured to perform a linear combination of the first and second output signals.

5. The circuitry as claimed in claim 1, wherein the combination means is configured to perform an analog or digital combination algorithm in relation to the first and second output signals.

6. The circuitry as claimed in claim 1, wherein the combination means comprises an analog or digital arithmetical circuit.

7. The circuitry as claimed in claim 1, wherein the first functional-element stress influence function exhibits one or several components of the stress tensor describing the mechanical stress present in the semiconductor circuit chip.

8. The circuitry as claimed in claim 7, wherein the first functional-element stress influence function is a normal stress component and/or a shear stress component of the mechanical stress in the semiconductor circuit chip.

9. The circuitry as claimed in claim 1, wherein the second functional-element stress influence function comprises one or several components of the stress tensor describing the mechanical stress present in the semiconductor circuit chip.

10. The circuitry as claimed in claim 9, wherein the second functional-element stress influence function comprises a normal stress component and/or a shear stress component of the mechanical stress present in the semiconductor circuit chip.

11. The circuitry as claimed in claim 7, wherein the components of the stress tensor are the two normal stress components in the plane of the surface of the semiconductor circuit chip.

12. The circuitry as claimed in claim 1, wherein the first and/or second functional-element stress influence function comprises, in a first approximation, a linear combination of two stress direction components.

13. The circuitry as claimed in claim 1, wherein the first and/or second functional-element stress influence function comprises, in a first approximation, the sum of both normal stress components in the plane of the surface of the semiconductor circuit chip.

14. The circuitry as claimed in claim 1, wherein the first electronic functional-element parameter and/or the second electronic functional-element parameter comprise a temperature dependence.

15. The circuitry as claimed in claim 1, wherein the first and second functional elements are exposed, within a tolerance range, to the same mechanical stress present in the semiconductor material of the semiconductor circuit chip.

16. The circuitry as claimed in claim 1, wherein the first and second functional elements are exposed, within a tolerance range, to the same temperature in the semiconductor material of the semiconductor circuit chip.

17. The circuitry as claimed in claim 1, wherein the first and second functional elements are arranged on the semiconductor circuit chip so as to be immediately adjacent to one another.

18. The circuitry as claimed in claim 1, wherein the first and second functional elements are arranged to be interlaced.

19. The circuitry as claimed in claim 1, wherein the first and second functional elements are arranged centrally on the semiconductor circuit chip.

20. The circuitry as claimed in claim 1, wherein the first functional element comprises a device of a group of devices, the group comprising a Hall probe element, a vertical bipolar transistor, a lateral bipolar transistor, a diode, an n-type diffusion resistor, a p-type diffusion resistor, an n-type implantation resistor, a p-type implantation resistor, a field-effect transistor, a polysilicon resistor of a polysilicon semiconductor material, or metal, SiCr, NiCr resistors.

21. The circuitry as claimed in claim 1, wherein the second functional element comprises a device of a group of devices, the group comprising a Hall probe element, a vertical bipolar transistor, a lateral bipolar transistor, a diode, an n-type diffusion resistor, a p-type diffusion resistor, an n-type implantation resistor, a p-type implantation resistor, a field-effect transistor, a polysilicon resistor of a polysilicon semiconductor material, or metal, SiCr, NiCr resistors.

22. The circuitry as claimed in claim 20, wherein the first functional element is a Hall probe element, and the first electronic functional-element parameter is the current-related magnetic sensitivity and/or the bulk resistance of the Hall probe element.

23. The circuitry as claimed in claim 21, wherein the second functional element is a Hall probe element, and the second electronic functional-element parameter is the current-related magnetic sensitivity and/or the bulk resistance of the Hall probe element.

24. The circuitry as claimed in claim 20, wherein the first functional element is a vertical bipolar transistor, and the first electronic functional-element parameter is the saturation current which is influenced by the piezojunction effect and is flowing through the vertical bipolar transistor.

25. The circuitry as claimed in claim 21, wherein the second functional element is a vertical bipolar transistor, and the second electronic functional-element parameter is the saturation current which is influenced by the piezojunction effect and is flowing through the vertical bipolar transistor.

26. The circuitry as claimed in claim 20, wherein the first functional element is a diode, and the first electronic functional-element parameter is the saturation current which is influenced by the piezojunction effect and is flowing through the diode.

27. The circuitry as claimed in claim 21, wherein the second functional element is a diode, and the second electronic functional-element parameter is the saturation current which is influenced by the piezojunction effect and is flowing through the diode.

28. The circuitry as claimed in claim 20, wherein the first functional element is a diffusion resistor, and the first electronic functional-element parameter is the resistance of the diffusion resistor.

29. The circuitry as claimed in claim 21, wherein the second functional element is a diffusion resistor, and the second electronic functional-element parameter is the resistance of the diffusion resistor.

30. The circuitry as claimed in claim 20, wherein the first functional element is an implantation resistor, and the first electronic functional-element parameter is the resistance of the implantation resistor.

31. The circuitry as claimed in claim 21, wherein the second functional element is an implantation resistor, and the second electronic functional-element parameter is the resistance of the implantation resistor.

32. The circuitry as claimed in claim 1, wherein the semiconductor material of the semiconductor circuit chip comprises a {100} silicon semiconductor material.

33. The circuitry as claimed in claim 1, wherein the semiconductor material of the semiconductor circuit chip comprises a {111} silicon semiconductor material.

34. The circuitry as claimed in claim 1, wherein the semiconductor material of the semiconductor circuit chip comprises a {110} silicon semiconductor material.

35. The circuitry as claimed in claim 20, wherein the diffusion resistor is a 90° arrangement of partial resistors.

36. The circuitry as claimed in claim 20, wherein the implantation resistor is a 90° arrangement of partial resistors.

37. The circuitry as claimed in claim 20, wherein the polysilicon resistor is a 90° arrangement of partial resistors.

38. The circuitry as claimed in claim 35, wherein the 90° arrangement of partial resistors preferably comprises a ±45° alignment to the primary flat in the case of p-doped resistors, and preferably a 0° and/or 90° alignment to the primary flat in the case of n-doped resistors.

39. The circuitry as claimed in claim 38, wherein the semiconductor material is <100> silicon.

40. The circuitry as claimed in claim 1, wherein the first and second functional elements comprise different, but isotropic stress dependencies in a {100} semiconductor material.

41. Circuitry on a semiconductor circuit chip, comprising:

a first functional element having a first electronic functional-element parameter, the first electronic functional-element parameter being representable by the following relationship:

$$F(T) = F_0(T)(1 + \pi_F(T) f_F(\underline{\sigma})),$$

wherein $F_0(T)$ is a basic value of the first electronic functional-element parameter, $\pi_F$ is a first scalar piezo influence factor for describing the influence of the mechanical stress in the semiconductor circuit chip on the first electronic functional-element parameter, and $f_F(\underline{\sigma})$ is a first scalar functional-element stress influence function for providing a scalar description of the mechanical stress in the semiconductor circuit chip, the first functional element being configured to provide a first output signal in dependence on the first electronic functional-element parameter and the mechanical stress, a second functional element having a second electronic functional-element parameter, the second electronic functional-element parameter being representable by the following relationship:

$$G(T) = G_0(T)(1 + \pi_G(T) f_G(\underline{\sigma}))$$

wherein $G_0(T)$ is a basic value of the second electronic functional-element parameter, $\pi_G$ is a second scalar piezo influence factor for describing the influence of the mechanical stress in the semiconductor circuit chip on the second electronic functional-element parameter $G_0(T)$, and $f_G(\underline{\sigma})$ is a second scalar functional-element stress influence function for providing a scalar description of the mechanical stress in the semiconductor circuit chip, the second functional element being configured to provide a second output signal dependence on the second electronic functional-element parameter and the mechanical stress, and a combination means for combining the first and second output signals to obtain a resulting output with a predefinable dependence on the mechanical stress in the semiconductor circuit chip, the first and second functional elements being integrated on the semiconductor circuit chip and arranged, geometrically, such that the first and second functional-element stress influence functions are identical within a tolerance range with a deviation of less than 10%.

42. The circuitry as claimed in claim 1, wherein the first piezo influence factor and the second piezo influence factor are different from one another.

* * * * *